United States Patent
Komobuchi et al.

(10) Patent No.: US 6,248,133 B1
(45) Date of Patent: Jun. 19, 2001

(54) SOLID STATE IMAGING DEVICE AND A METHOD OF DRIVING THE SAME

(75) Inventors: Hiroyoshi Komobuchi, Kyoto; Akira Fukumoto, Osaka; Takahiro Yamada, Osaka; Takao Kuroda, Osaka; Yuji Matsuda, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/631,834

(22) Filed: Apr. 10, 1996

Related U.S. Application Data

(63) Continuation-in-part of application No. 08/261,841, filed on Jun. 17, 1994, now abandoned.

(30) Foreign Application Priority Data

Apr. 10, 1995 (JP) ................................................. 7-084380

(51) Int. Cl.[7] ................................................. H04M 5/335
(52) U.S. Cl. ............................................ 3148/315; 348/311
(58) Field of Search .................................... 348/294, 311, 348/315, 316, 317, 318, 319, 320, 321, 322, 323, 324, 296; 257/232, 233, 240, 247, 249; H04N 5/335

(56) References Cited

U.S. PATENT DOCUMENTS

| | | | |
|---|---|---|---|
| 4,847,692 | * | 7/1989 | Tabei ..................................... 348/315 |
| 4,860,326 | * | 8/1989 | Mutoh ..................................... 348/311 |
| 5,243,180 | * | 9/1993 | Nam ....................................... 348/311 |
| 5,280,186 | * | 1/1994 | Lee ......................................... 257/232 |
| 5,286,990 | * | 2/1994 | Hynecek .............................. 348/332 |

FOREIGN PATENT DOCUMENTS

| | | |
|---|---|---|
| 0 630 151 | 12/1994 | (EP) . |
| 64-37869 | 2/1989 | (JP) . |
| 7-15672 | 1/1995 | (JP) . |

* cited by examiner

*Primary Examiner*—Tuan Ho
(74) *Attorney, Agent, or Firm*—Ratner & Prestia

(57) ABSTRACT

A solid state imaging device has: a first polysilicon layer 901; a second polysilicon layer 902; a photoelectric converting portion or PD 903; a read gate 904; a read channel 905 (in this case, an N-layer) which is formed in a semiconductor below the read gate; a P-layer 906 which prevents a signal charge from erroneously entering a VCCD of a unit pixel adjacent in a horizontal direction; a P-layer 907 which defines the transfer channel region of a VCCD; and a VCCD 908 which transfers a signal charge in the direction of the arrows. A unit pixel 900 is indicated by a one-dot chain line. The two-dimensionally arrayed solid state imaging device is driven by driving pulses of eight phases in total, namely, a driving pulse φV1 911, a driving pulse φV2 912, a driving pulse φV3 913, a driving pulse φV4 914, a driving pulse φV5 915, a driving pulse φV6 916, a driving pulse φV7 917, and a driving pulse φV8 918.

32 Claims, 35 Drawing Sheets

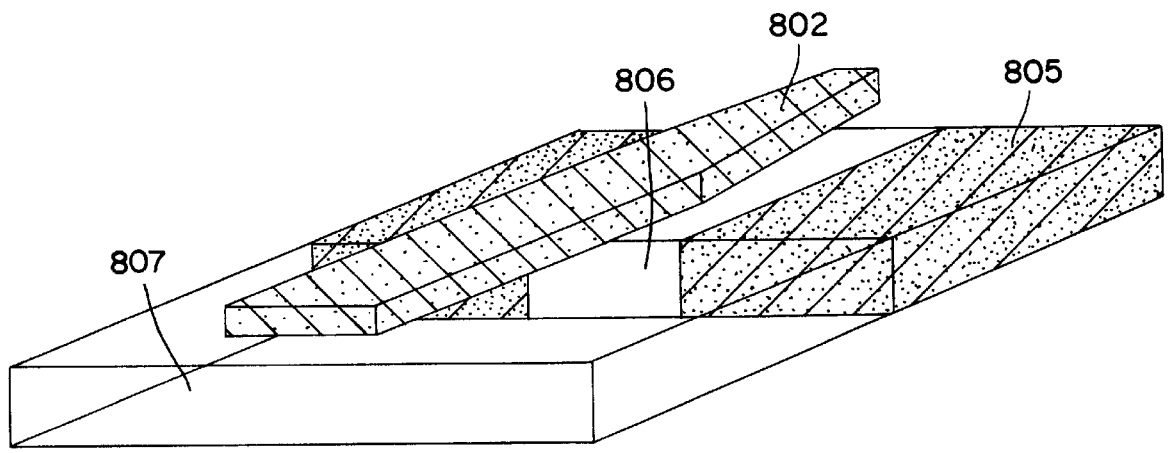
F I G. 23
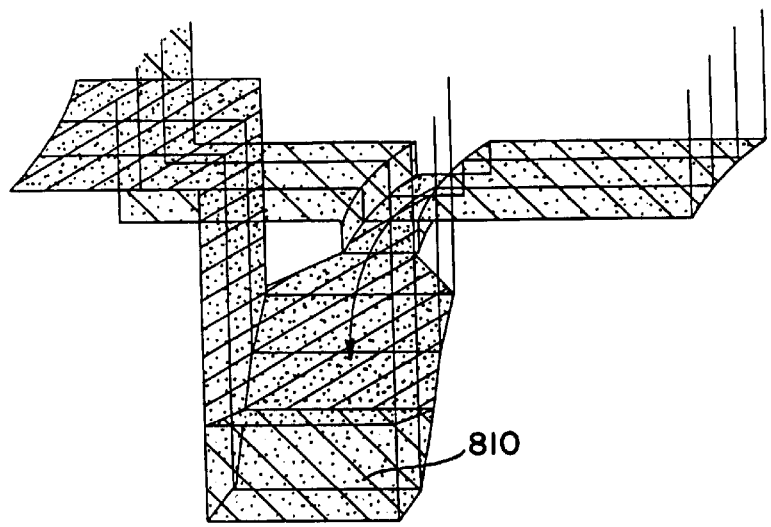
F I G. 24

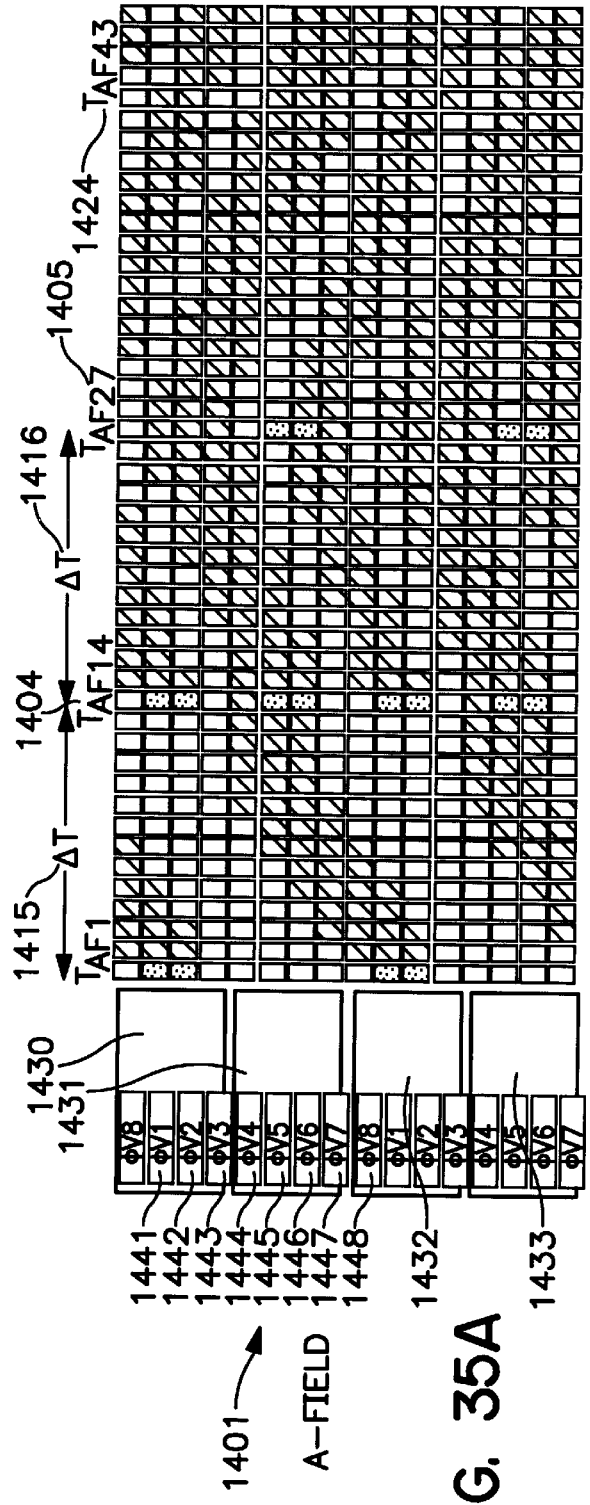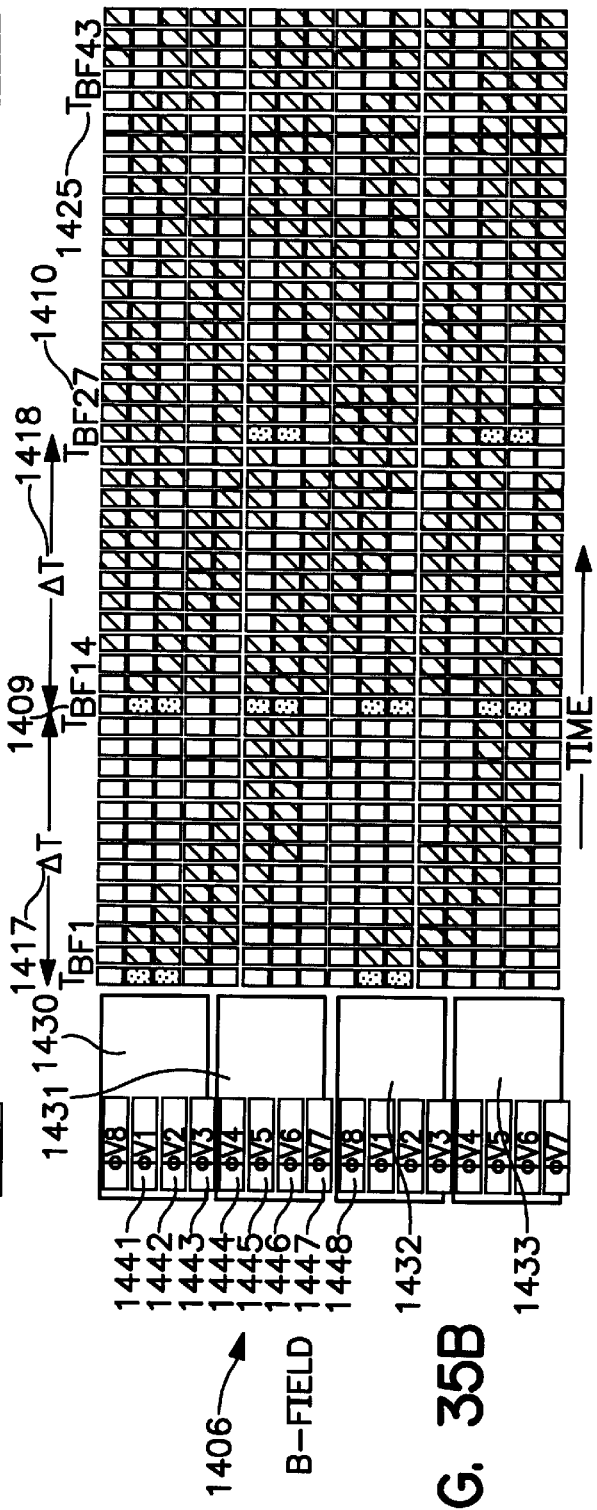

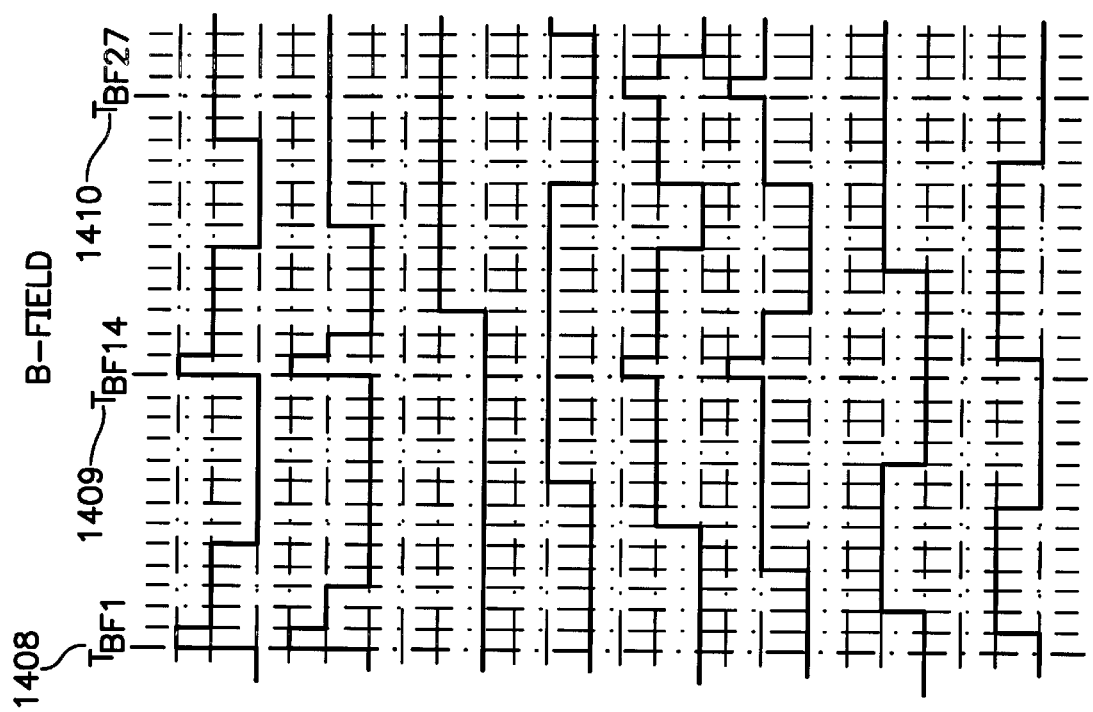
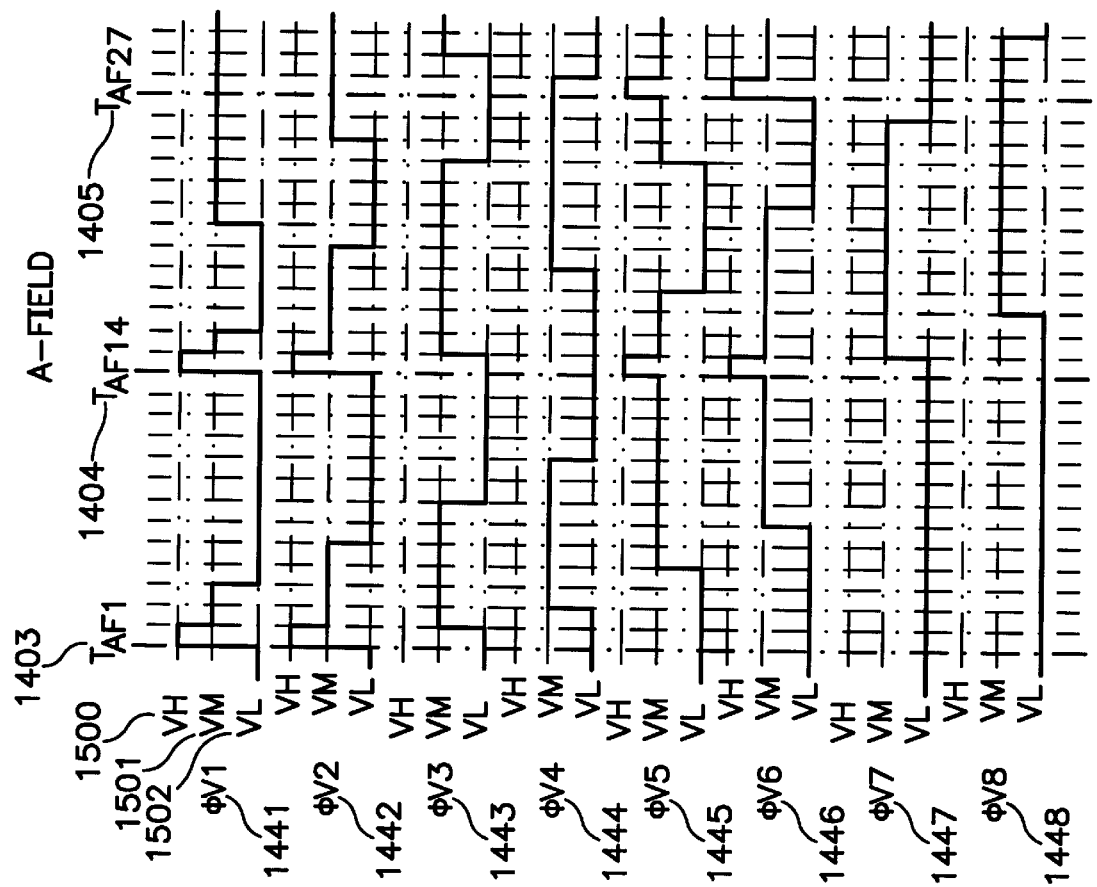
FIG. 36B
FIG. 36A

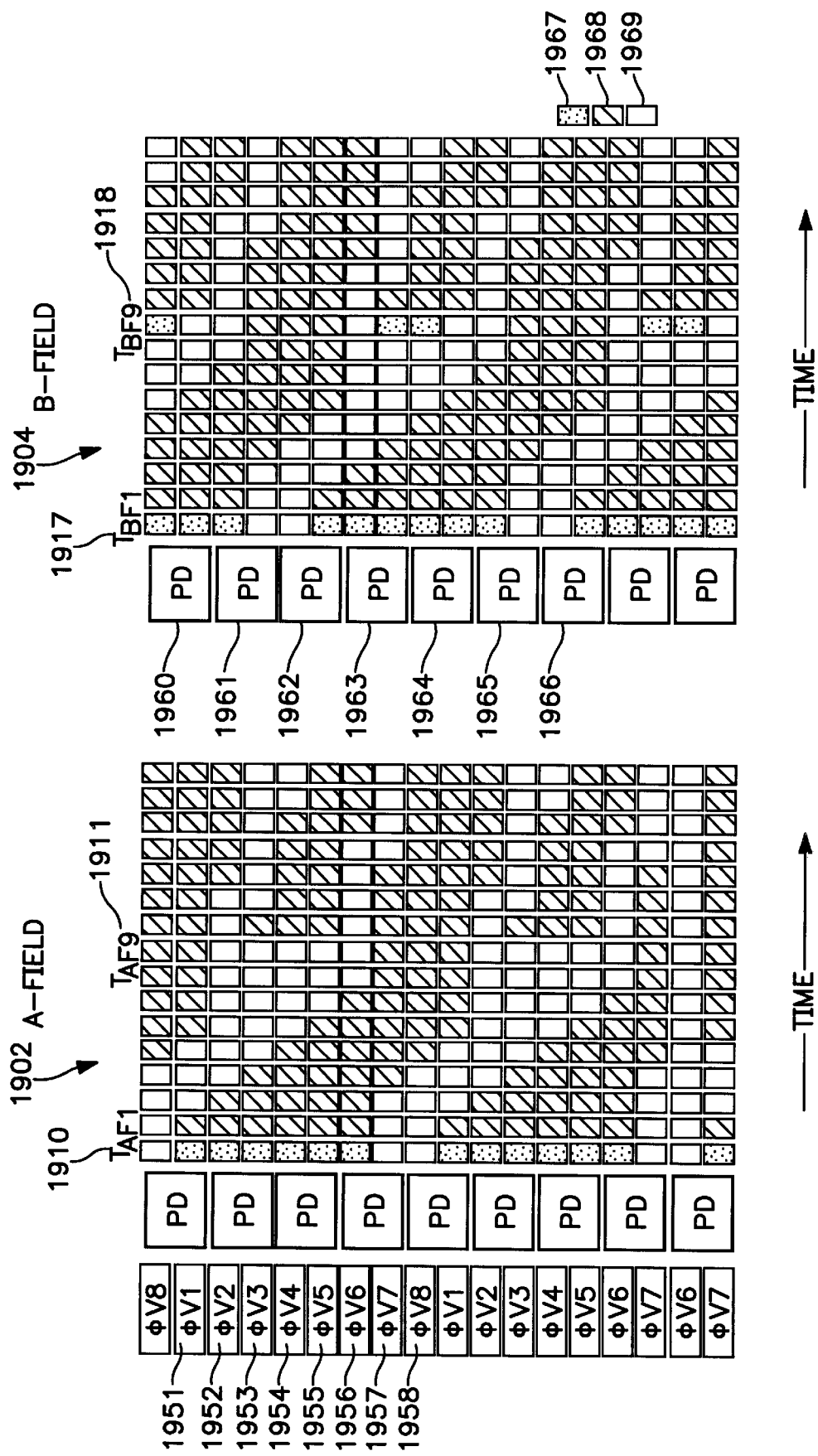

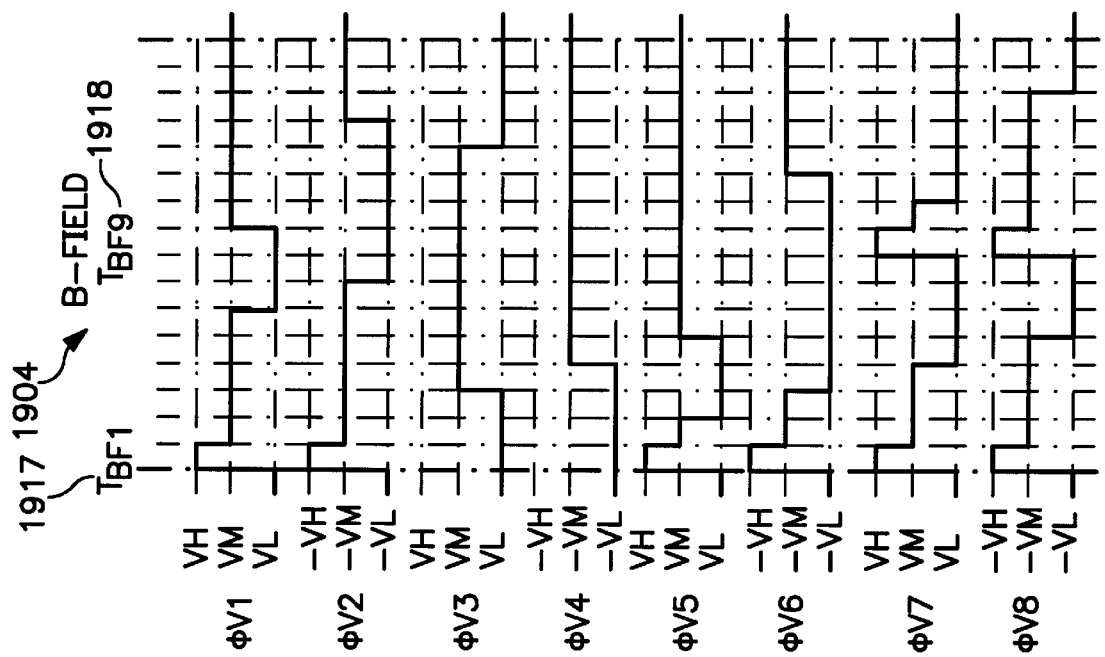
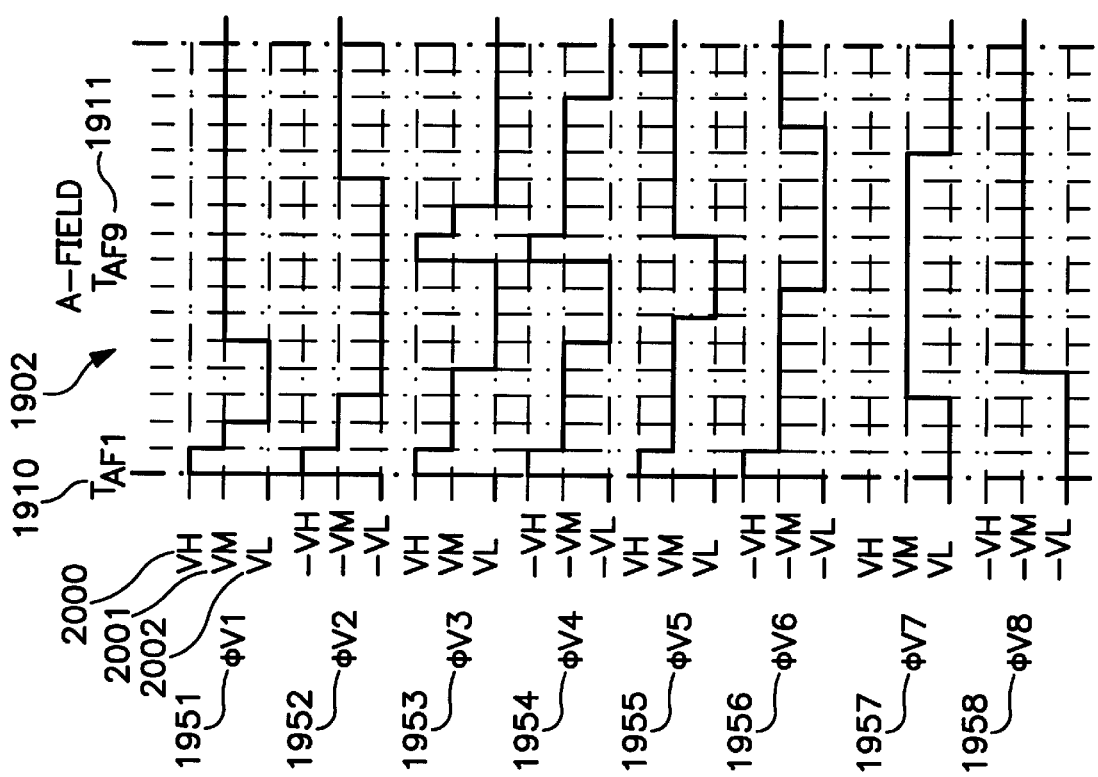

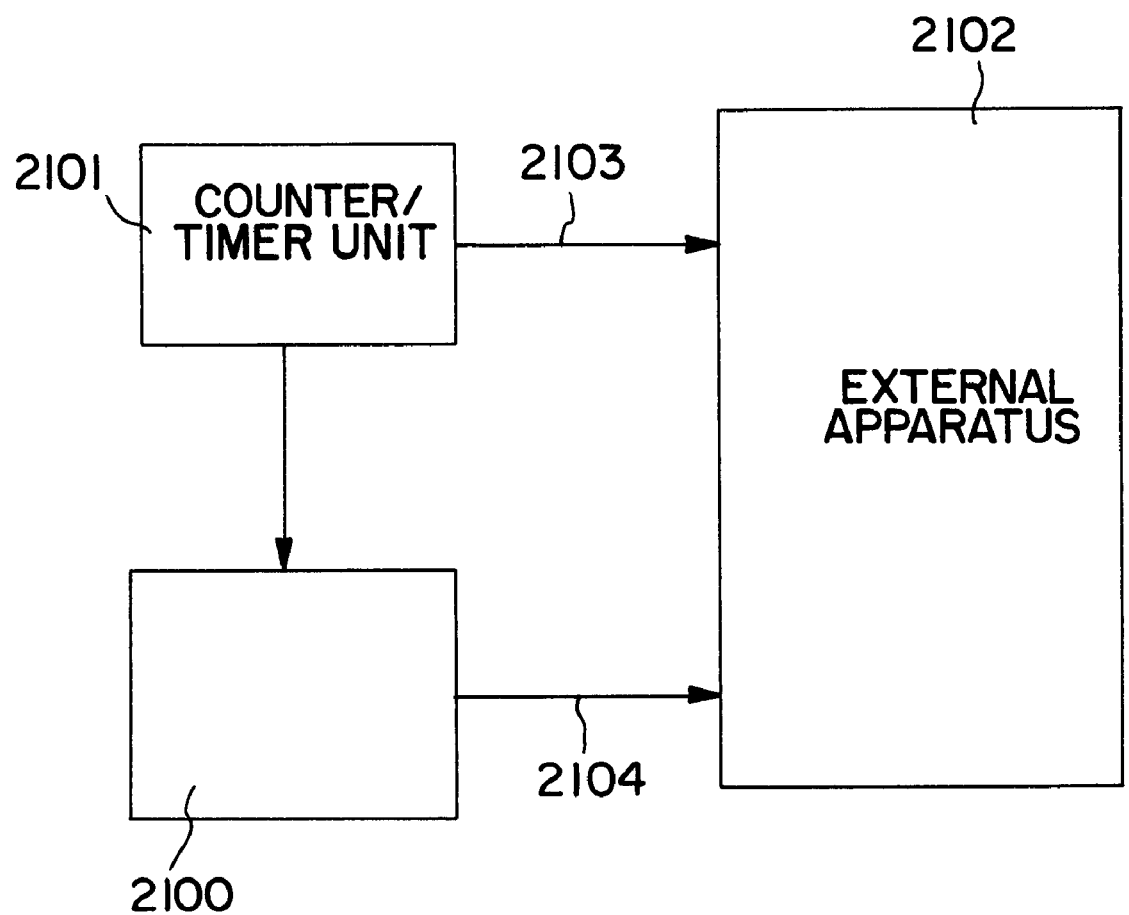
F I G. 45

SOLID STATE IMAGING DEVICE AND A METHOD OF DRIVING THE SAME

This application is a continuation-in-part of U.S. patent application Ser. No. 08/261,841 (filed on Jun. 17, 1994 now abandoned).

BACKGROUND OF THE INVENTION

1. Field of the Invention

The invention relates to a solid state imaging device having a reading gate mechanism which can realize miniaturization of it and to a method of driving the device.

2. Related Art of the Invention

Conventionally there are a isolating region for isolating the photoelectric converting parts of pixels and a reading region for reading electric charge stored in the each photoelectric converting parts. These regions are invalid region about sensitivity and saturation characteristics and the area of the photoelectric converting parts is large enough, there is little effect on account of the invalid region and it is not significant for the practical use.

However the miniaturization of CCD is required recently and the above invalid region can not be disregarded and then deterioration of sensitivity and saturation characteristics become large.

That is miniaturization of a solid state imaging device produces insufficient sensitivity due to reduction of the light receiving area, and reduction of the incident light range due to reduction of the pixel area. At present, a CCD solid state imaging device of the ⅓-inch class has the incident light range of about 8 bits. When objects of about 5,000 Lx and 5 Lx exist in the same screen, for example, one of the objects must be sacrificed. This produces a problem peculiar to a photographic process in so-called backlight or excessive forwardlight in the following manner: If the aperture of the lens or the electronic shutter is set to 5,000 Lx, the sensitivity is insufficient for the object of 5 Lx so that an image of the object cannot be taken. By contrast, if the aperture of the lens or the electronic shutter is set to 5 Lx, the object of 5,000 Lx causes a signal charge of an amount exceeding the signal charge amount range of the solid state imaging device to be generated, thereby causing overexposure.

Meanwhile for expanding the incident light range, such method that in one field period two kinds of image signals which have different exposure period to each other are read out to outside is known.

However the prior structure has problem due to miniaturization of an element:

That is in order to improve the sensitivity and saturation characteristics it is suggested to make the photoelectric part large but there are isolation part and reading part separately to each other and the enlarging of the photoelectric part is restricted.

SUMMARY OF THE INVENTION

According to the invention, a read gate which is specially disposed in the prior art is eliminated, and a pixel isolating portion exhibits also the reading function, thereby improving the actual opening area so that the sensitivity is enhanced. In order to completely conduct the reading from a pixel portion to a transfer portion, a potential gradient (incline) is formed in a photoelectric converting portion or a read gate. And signal charge amounts obtained in two kinds of exposure periods are independently read/transferred for each line to vertical charge transferring means (Vertical Charge Coupled Device), thereby eliminating an external field memory.

A solid state imaging device of the present invention is characterized in that a unit pixel comprises:

at least one photoelectric converting portion which is disposed in order to convert an electromagnetic wave or an X-ray entering said unit pixel into a signal charge and which contains a first impurity; and charge transferring means adjacent to said photoelectric converting portion in an X-direction and for transferring said signal charge in a Y-direction, and at boundaries of photoelectric converting portions adjacent to each other in the Y-direction in the unit pixels which are arranged in a one-dimensional direction of Y-direction or in two-dimensional directions of X- and Y-directions, there is first means which serves as isolating said photoelectric converting portions from each other, and also as reading a signal charge from said photoelectric converting portion into said charge transferring means.

A driving method for a solid state imaging device of the present invention is characterized in that a unit pixel comprises:

at least one photoelectric converting portion which is disposed in order to convert an electromagnetic wave or an X-ray entering said unit pixel into a signal charge and which contains a first impurity; and charge transferring means adjacent to said photoelectric converting portion in an X-direction and for transferring said signal charge in a Y-direction, and at boundaries of photoelectric converting portions adjacent to each other in the Y-direction in the unit pixels which are arranged in a one-dimensional direction of Y-direction or in two-dimensional directions of X- and Y-directions, there is first means which serves as isolating said photoelectric converting portions from each other, and also as reading a signal charge from said photoelectric converting portion into said charge transferring means, and when said device is driven, the isolating function and the reading function are realized alternately in the Y-direction, by the first means at a specific field and further at a next field the isolating function and the reading function are exchanged.

A solid state imaging device of the present invention is characterized in that a unit pixel comprises:

at least one photoelectric converting portion which is disposed in order to convert an electromagnetic wave or an X-ray entering said unit pixel into a signal charge and which contains a first impurity; and charge transferring means adjacent to said photoelectric converting portion in an X-direction and for transferring said signal charge in a Y-direction, and at boundaries of photoelectric converting portions adjacent to each other in the Y-direction in the unit pixels which are arranged in a one-dimensional direction of Y-direction or in two-dimensional directions of X- and Y-directions, there are alternately in Y-direction (1) isolating means for isolating said photoelectric converting portions from each other, and (2) reading means for reading a signal charge from said photoelectric converting portion into said charge transferring means.

A method of driving a solid state imaging device of the present invention is characterized in that for said charge transferring means (typified by a CCD) possessed by continuous unit pixels A and B, first and second signal charge transfer packets having a total of eight continuous transfer electrodes are disposed; a first signal charge A generated by an electromagnetic wave or X-ray signal during a first accumulation period of said unit pixel A, and a first signal charge B generated by the electromagnetic wave or X-ray signal during a second accumulation period of said unit pixel B are read at the same timing and then added and mixed to said first signal charge packet; and a second signal charge A generated by the electromagnetic wave or the X-ray during a third accumulation period of said unit pixel A, and a second signal charge B generated by the electromagnetic wave or the X-ray during a fourth accumulation period of said unit pixel B are read at the same timing and then added and mixed to said second signal charge packet, at least one of sets of said first and second accumulation periods and said third and fourth accumulation periods having the same accumulation period.

Although the imaging device can be miniaturized, the sensitivity and the handled charged amount with respect to the amount of incident light can be improved. Although a signal charge is read from the isolating portion, the reading of a signal charge from the photoelectric converting portion can be realized without producing an afterimage.

BRIEF DESCRIPTION OF THE DRAWINGS

FIG. 23 is a perspective view of the unit pixel.

FIG. 24 is a diagram showing a potential distribution of the unit pixel.

FIG. 35 is a chart of signal charge transfer.

FIG. 36 is a timing chart.

FIG. 41 is a timing chart.

FIG. 43 is a chart of signal charge transfer.

FIG. 44 is a timing chart.

FIG. 45 is a block diagram of a solid state imaging device.

PREFERRED EMBODIMENTS

A first embodiment of the invention will be described with reference to FIG. 1.

Figure 46:
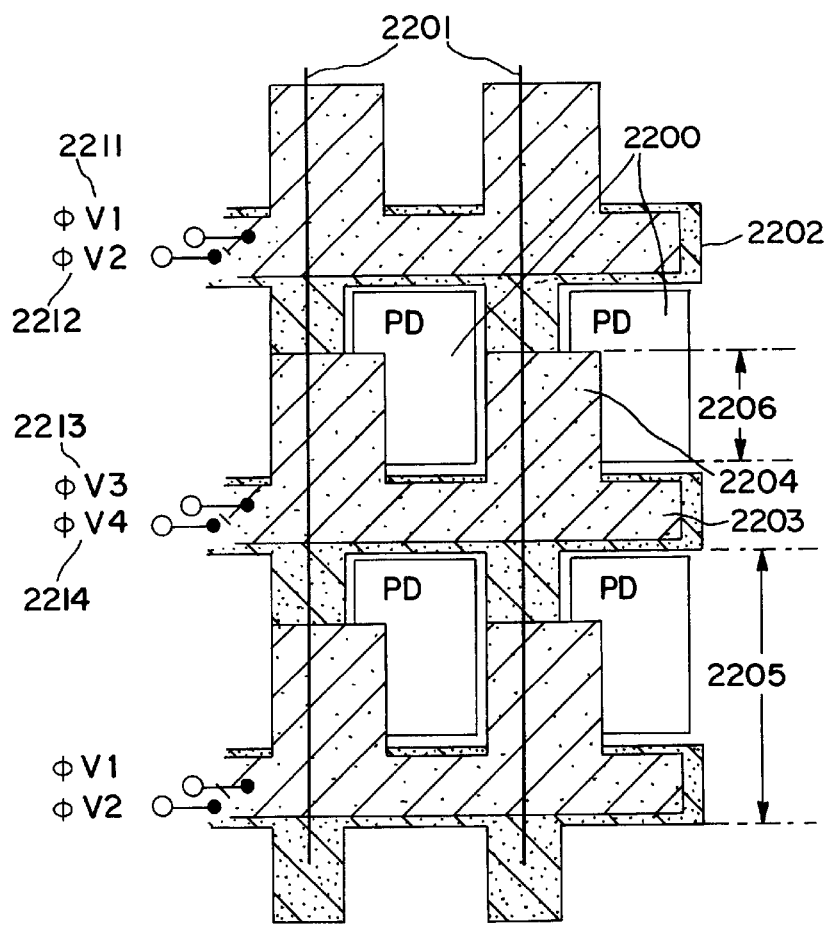
FIG. 46 is a plan view of a solid state imaging device.

As a comparison, FIG. 46 shows a plan view of a prior art CCD solid state imaging device. In the prior art CCD structure, as shown in FIG. 46, a VCCD 2201 which is signal charge transferring means is configured adjacent to a PD (Photodiode) 2200 which is a photoelectric converting portion. In order to apply four-phase driving pulses, the VCCD 2201 is configured by a driving pulse φV1 2211, a driving pulse φV2 2212, a driving pulse φV3 2213, and a driving pulse φV4 2214. Read gates 2204 disposed in the driving pulse φV1 2211 and the driving pulse φV3 2213 are set for the reading of a signal charge from the photodiode which is the PD 2200 to the VCCD 2201 which is vertical transferring means. In the prior art CCD structure, as the CCD size is made smaller, a V pitch 2205 which is a vertical repetition unit of the pixel size is made smaller, and also a read gate width 2206 is made smaller. As a result of the narrow channel effect due to the reduced read gate width 2206, the first and third driving pulses 2211 and 2213 require a high voltage (for example, 15 V or higher) as the read voltage which is necessary for the reading of a signal charge from the photodiode which is the PD 2200 to the VCCD 2201.

Figure 1:
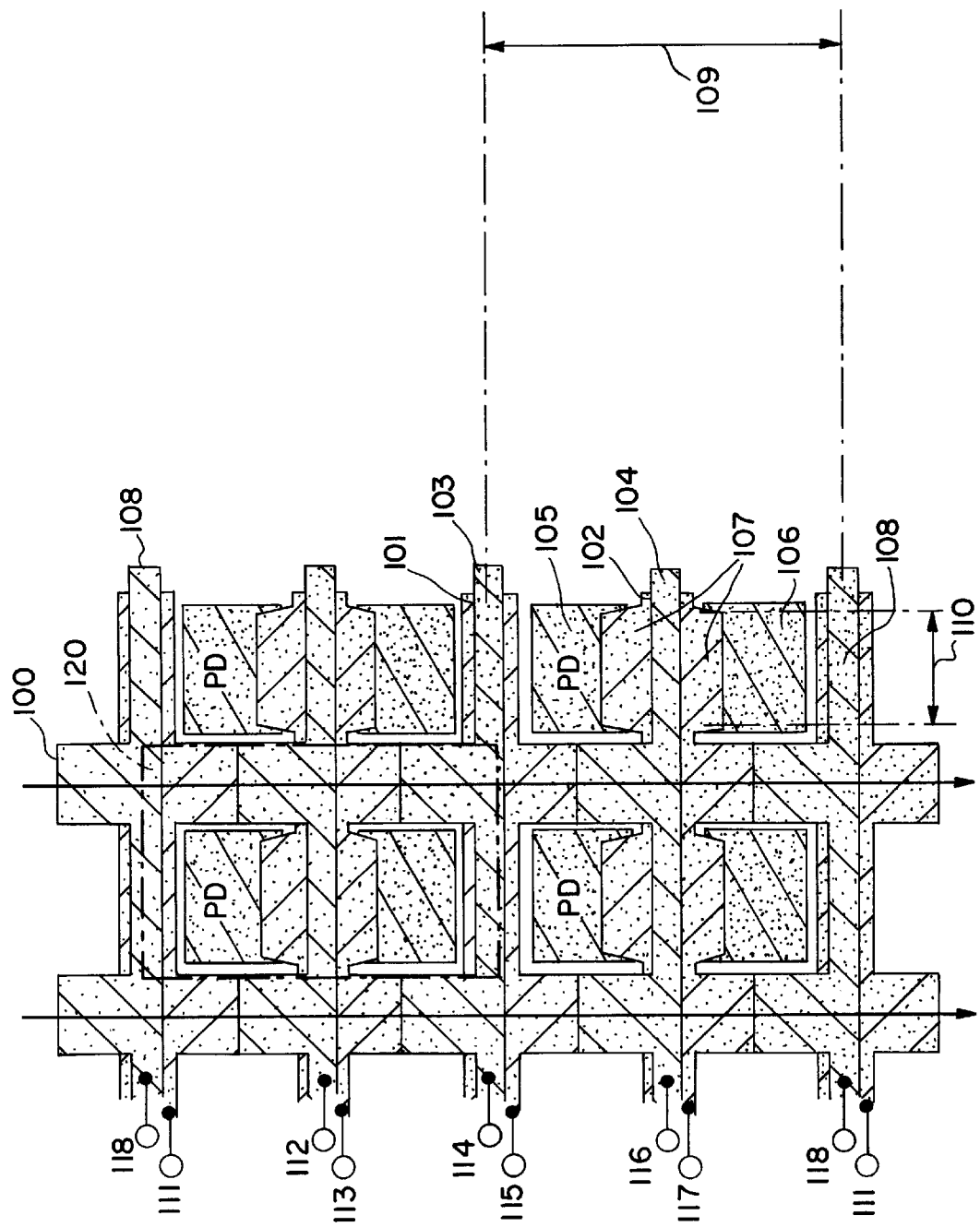
FIG. 1 is a plan view of a solid state imaging device.

FIG. 1 shows the first embodiment. In the embodiment, a unit pixel consists of electrodes, i.e., a first polysilicon layer 101; a first polysilicon layer 102, a second polysilicon layer 103, and a second polysilicon layer 104, and PDs (Photo Diodes) 105 and 106 which serve as photoelectric converting portions. To the polysilicon layers which function as electrodes of a VCCD 100 serving as vertical charge transferring means, applied are a driving pulse φV1 111, a driving pulse φV2 112, a driving pulse φV3 113, a driving pulse φV4 114, a driving pulse φV5 115, a driving pulse φV6 116, a driving pulse φV7 117, and a driving pulse φV8 118. A read gate 107 is disposed at the center of one pixel which serves as a unit pixel 120. When the structure of the present proposal is employed, in the case where densification along the direction of the VCCD 100 is required, it is possible to ensure a read gate width 110 which is substantially constant in spite of the reduction of a V pitch 109. In the use for the progressive scan wherein double density is required in the vertical direction or for a high definition television, therefore, the rise of the read voltage due to the above-mentioned narrow channel effect can be prevented from occurring. In the embodiment, a vertical isolating portion 108 is disposed between pixels, thereby configuring a unit pixel so that the unit pixel always has the same pair of PDs (so that in, for example, the reading process a read voltage is applied to the driving pulse φV7 117, whereby signal charges accumulated in the pair of PDs 105 and 106 are always mixed with each other and read to the VCCD 100). In the embodiment, the first and second polysilicon layers may be replaced in structure and function with each other without causing any problem. In the above, eight kinds of the pulses of applied voltages φV1 to φV8 have been described. It is a matter of course that, even when the same driving pulse is applied to φV1 and φV5, φV2 and φV6, φV3 and φV7, and φV4 and φV8 or four or less kinds of pulses are used, the device can function as a solid state imaging device in the same manner as a prior art one. The embodiment described above has the two-layer polysilicon structure. It should be additionally mentioned that the invention can be executed by using a polysilicon structure having three or more layers. The PDs 105 and 106 may be connected to each other in the semiconductor substrate below the read gate 107, or alternatively may not be connected to each other.

Figure 2:
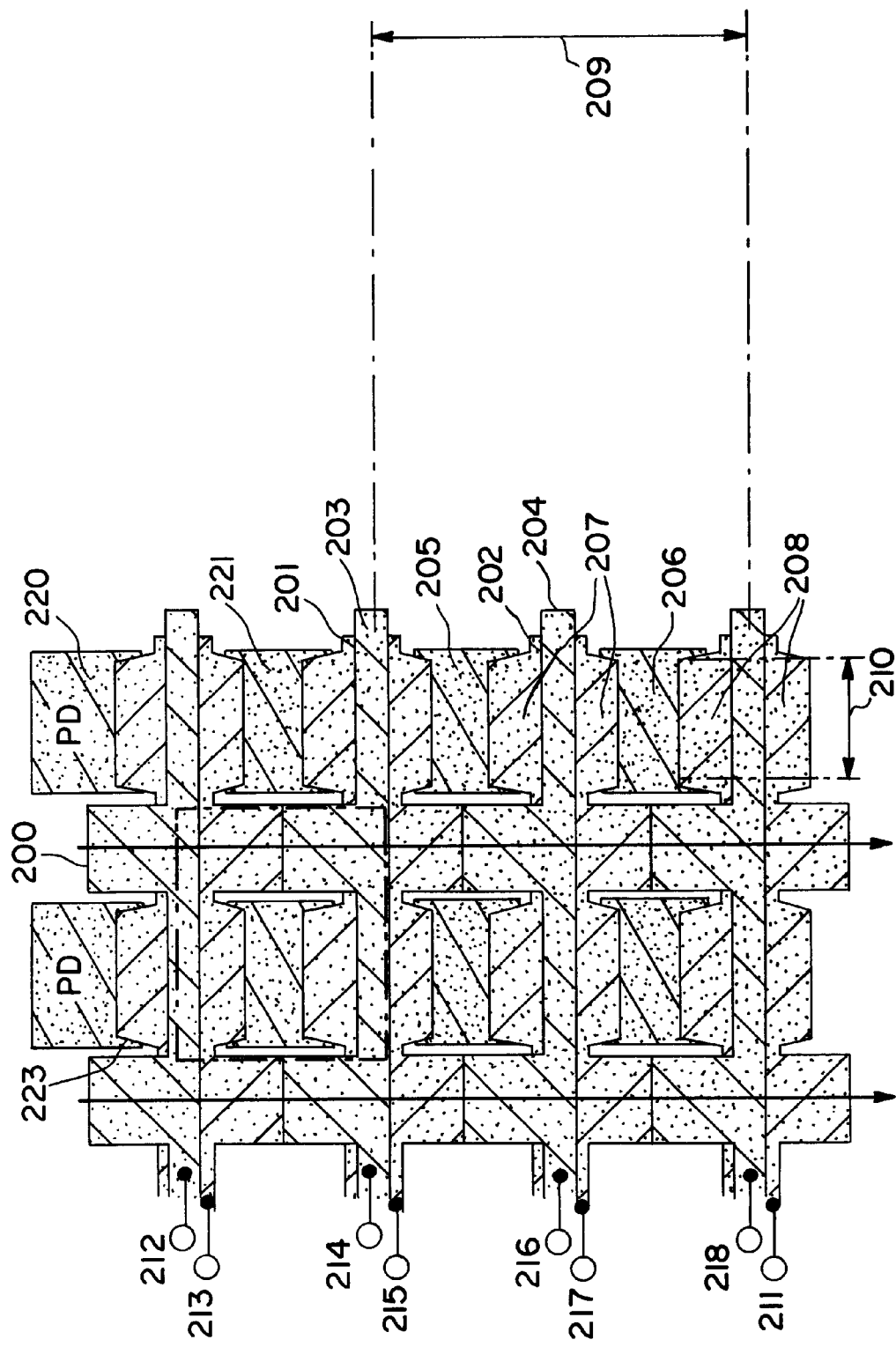
FIG. 2 is a plan view of a solid state imaging device.

FIG. 2 shows a second embodiment. FIG. 2 shows a configuration in which the vertical isolating portion 108 in FIG. 1 is eliminated or replaced with read gates 207 and 208. In the embodiment, a unit pixel consists of electrodes, i.e., a first polysilicon layer 201, a first polysilicon layer 202, a second polysilicon layer 203, and a second polysilicon layer 204, and PDs 205 and 206 which serve as photoelectric converting portions. To the polysilicon layers which function as electrodes of a VCCD 200, applied are a driving pulse φV1 211, a driving pulse φV2 212, a driving pulse φV3 213, a driving pulse φV4 214, a driving pulse φV5 215, a driving pulse φV6 216, a driving pulse φV7 217, and a driving pulse φV8 218. A read gate 207 is disposed at the center of one pixel which serves as a unit pixel 223. When the structure of the embodiment is employed, in the case where densification along the direction of the VCCD 200 is required, it is possible to ensure a read gate width 210 which is substantially constant in spite of the reduction of a V pitch 209. Therefore, the rise of the read voltage due to the above-mentioned narrow channel effect can be prevented from occurring. In the embodiment, the read gates 207 and 208 are always disposed in a vertical direction between PDs, thereby enabling the solid state imaging device to have a configuration in which the unit pixels 223 are shifted in the vertical direction by a distance corresponding to one PD. As a result, the following reading method can be realized. In the reading process in the A-field, for example, a read voltage is applied to the driving pulses φV3 213 and φV7 217, whereby signal charges accumulated in the pair of PDs 220 and 221 and those accumulated in the pair of PDs 205 and 206 are independently mixed with each other and read to the VCCD 200. In the subsequent B-field, the read voltage is applied to the driving pulse φV5 215 and φV1 211, whereby charges accumulated in the pair of PDs 221 and 205 are independently mixed with each other and read to the VCCD 200.

In the embodiment, the first and second polysilicon layers may be replaced in structure and function with each other without causing any problem. In the above, eight kinds of the pulses of applied voltages φV1 to φV8 have been described. It is a matter of course that, even when the same driving pulse is applied to φV1 and φV5, φV2 and φV6, φV3 and φV7, and φV4 and φV8 or four or less kinds of pulses are used, the device can function as a solid state imaging device in the same manner as a prior art one. The embodiment described above has the two-layer polysilicon structure. It should be additionally mentioned that the invention can be executed by using a polysilicon structure having three or four layers.

Next, a third embodiment will be described with reference to FIGS. 3, 4, and 5.

Figure 3:
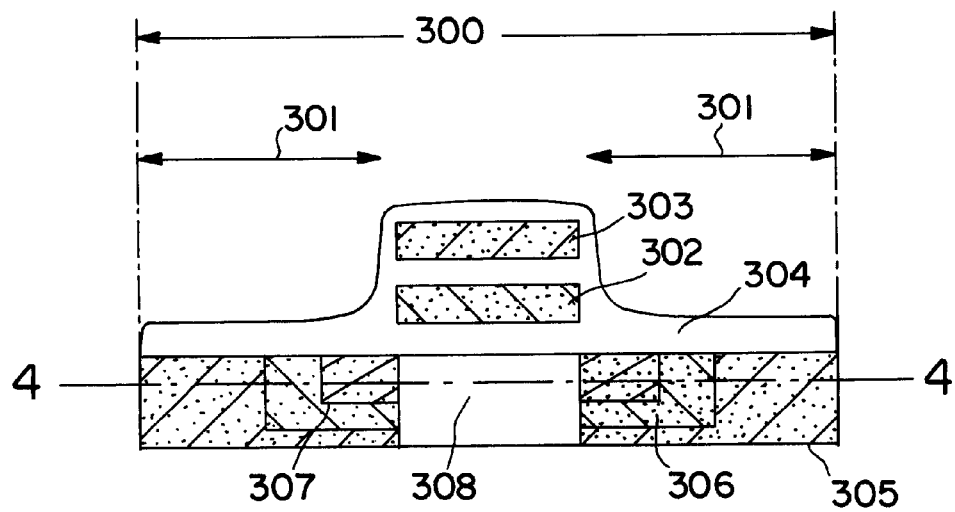
FIG. 3 is a section view of a unit pixel taken in the vertical direction.

FIG. 3 is a section view of the range of a V pitch 300 which indicates the vertical length of a unit pixel. In the figure, shown are a first N-layer 305, a second N-layer 306, and a third N-layer 307 which constitute a photoelectric converting region 301 disposed in a semiconductor substrate, a fourth N-layer 308, a fifth N-layer 309, and first and second polysilicon layers 302 and 303 which constitute a read gate via an oxide film 304.

As described above, the first to third N-layers 305 to 307 constitute the photoelectric converting portion. These N-layers are formed by, for example, ion implantations of an N-type impurity such as phosphorus. The ion implantations are conducted in three or more steps. The N-type impurity concentration of the second N-layer 306 is higher than that of the first N-layer 305, and the N-type impurity concentration of the third N-layer 307 is higher than that of the second N-layer 306. The fourth N-layer 308 forms a read channel for reading a signal charge generated in the semiconductor substrate of the photoelectric converting region 301, into the fifth N-layer 309 constituting a VCCD.

Figure 4:
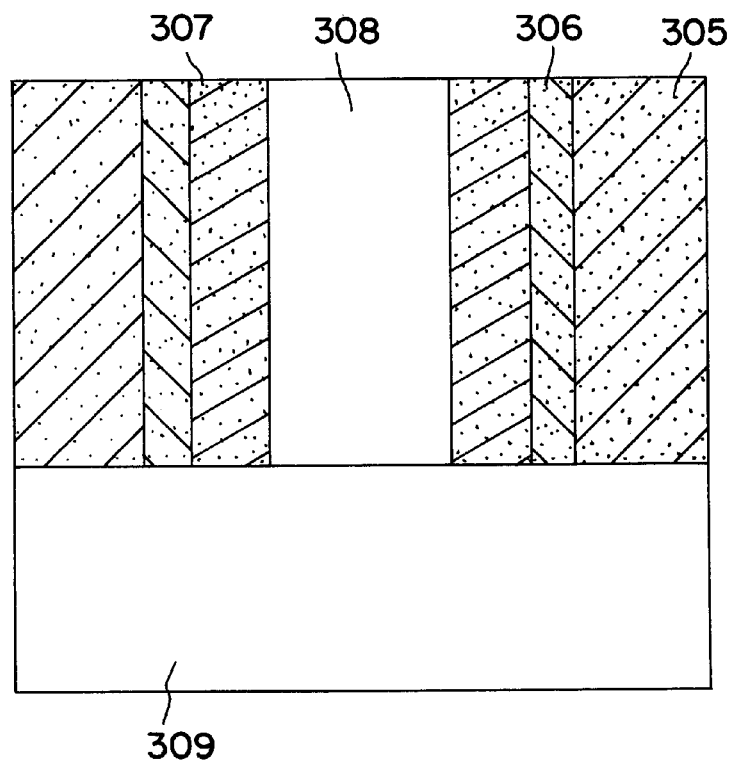
FIG. 4 is a section view of the unit pixel at a depth of X1–X1'.

FIG. 4 is a view showing a section as seen from the top and at a depth of X1–X1' parallel to the surface of the semiconductor, in order to facilitate the understanding of the impurity distribution in the semiconductor. As described above, the fifth N-layer 309 constitutes the VCCD portion which serves as vertical charge transferring means.

Figure 5:
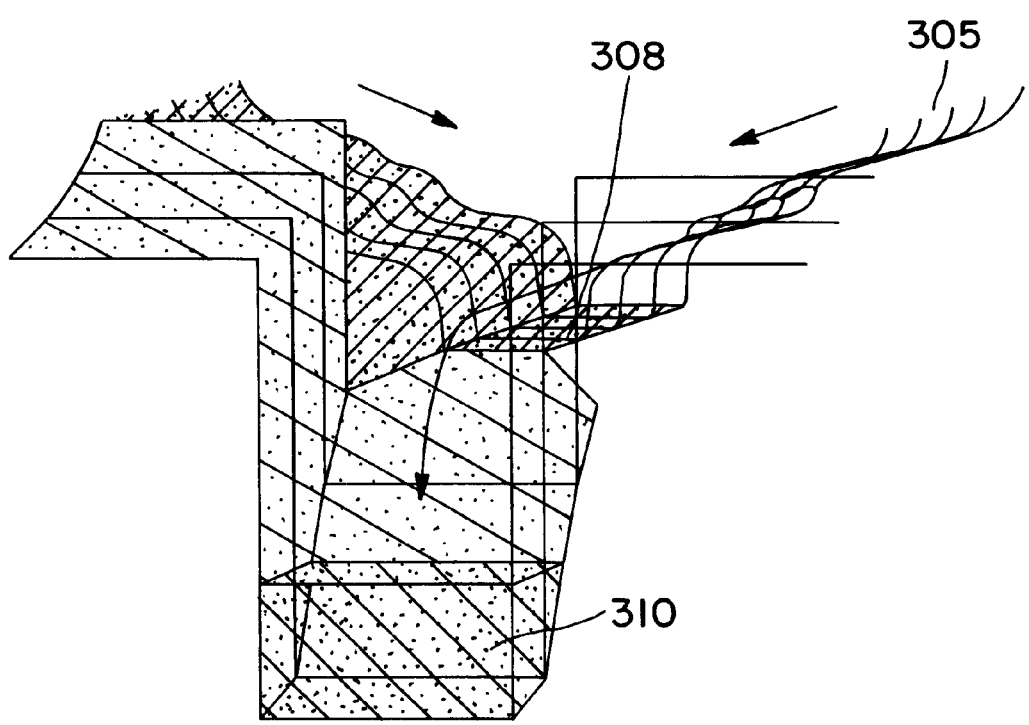
FIG. 5 is a diagram showing a potential distribution of the unit pixel.

FIG. 5 shows the potential distribution in the process of reading a signal charge in the unit pixel shown in FIGS. 3 and 4.

In the figure, the potential distribution in the semiconductor which is obtained when a read voltage (for example, 15 V) is applied to the first polysilicon layer 302 is shown. In the embodiment, the N-type impurity concentration of the second N-layer 306 is higher than that of the first N-layer 305, and the N-type impurity concentration of the third N-layer 307 is higher than that of the second N-layer 306. As shown in the figure, in a unit pixel, a monotonous potential gradient is produced in the semiconductor as moving from the first N-layer 305 forming the peripheral region of the photoelectric converting portion toward the read channel which is formed in the fourth N-layer 308 formed below the first polysilicon layer 302. This enables a signal charge 310 to be smoothly subjected to drift motion as indicated by the arrows.

In the above description, the three kinds of implantation regions, i.e., the first to third N-layers 305 to 307 are set in the photoelectric converting region 301. It should be additionally mentioned that, even when impurity concentration distribution layers having different concentrations are formed by two kinds of implantation regions or three or more kinds of implantation regions, or even when a P-type impurity is partly used in the peripheral region of the photoelectric converting portion, the function of producing a monotonous potential gradient in the semiconductor as moving from the peripheral region of the photoelectric converting portion toward the read channel which is formed below the first polysilicon layer 302 which serves as the read gate can be attained.

Next, a fourth embodiment will be described with reference to FIGS. 6, 7, and 8.

Figure 6:
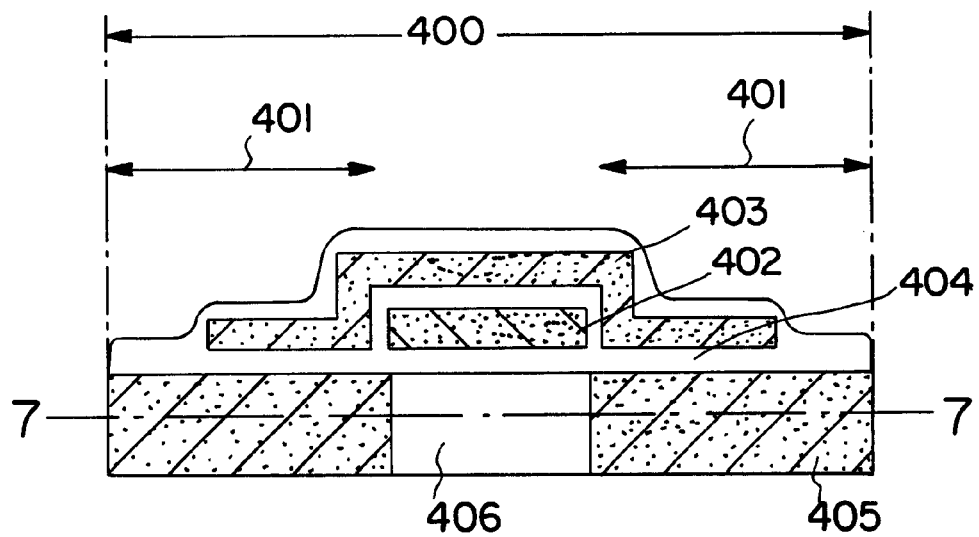
FIG. 6 is a section view of a unit pixel taken in the vertical direction.

FIG. 6 is a section view of the range of a V pitch 400 which indicates the vertical length of a unit pixel. In the figure, shown are a first N-layer 405 which constitutes a photoelectric converting region 401 disposed in a semiconductor substrate, a fourth N-layer 406, a fifth N-layer 407, and first and second polysilicon layers 402 and 403 which constitutes a read gate via an oxide film 404. The second polysilicon layer 403 is wider than the first polysilicon layer 402. In the photoelectric converting region 401, therefore, the second polysilicon layer 403 covers a part of or the whole of the upper portion of the first N-layer 405.

As described above, the first N-layer 405 constitutes the photoelectric converting portion. The N-layer is formed by ion implantation of an N-type impurity such as phosphorus, or the like. The ion implantation is in one step. The fourth N-layer 406 forms a read channel for reading a signal charge generated in the semiconductor substrate of the photoelectric converting region 401, into the fifth N-layer 407 constituting a VCCD.

Figure 7:
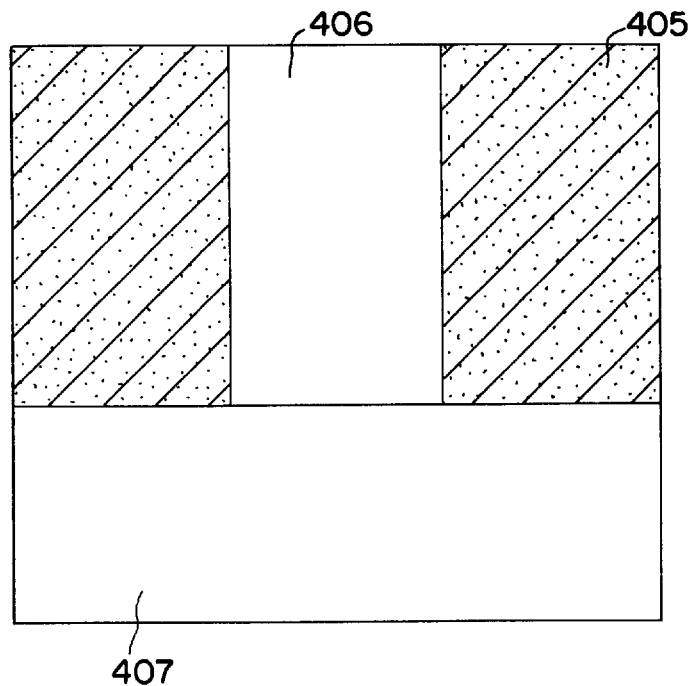
FIG. 7 is a section view of the unit pixel at a depth of X2–X2'.

FIG. 7 is a view showing a section as seen from the top and at a depth of X2–X2' parallel to the surface of the semiconductor, in order to facilitate the understanding of the impurity distribution in the semiconductor. As described above, the fifth N-layer 407 constitutes the VCCD portion which serves as vertical charge transferring means.

Figure 8:
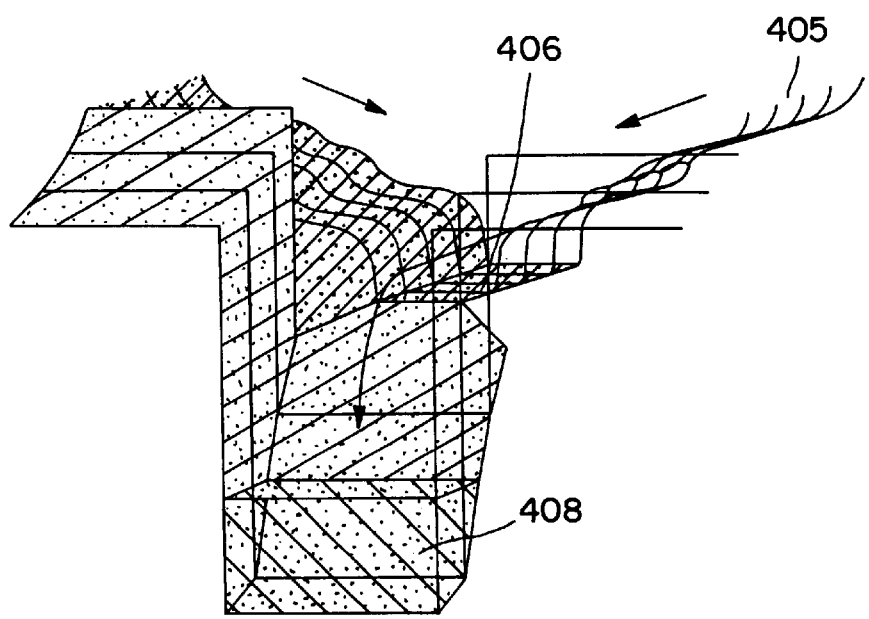
FIG. 8 is a diagram showing a potential distribution of the unit pixel.

FIG. 8 shows the potential distribution in the process of reading a signal charge in the unit pixel shown in FIGS. 6 and 7.

In the figure, the potential distribution in the semiconductor is shown which is obtained when a read voltage (for example, 15 V) is applied to the first polysilicon layer 402 and a voltage (for example, 13 V) which is equal to or slightly lower than that applied to the first polysilicon layer 402 is applied to the second polysilicon layer 403. In the embodiment, the second polysilicon layer 403 covers at least a part of the upper portion of the first N-layer 405 in the photoelectric converting region 401. As shown in the figure, in a unit pixel, a monotonous potential gradient is produced in the semiconductor as moving from the first N-layer 405 forming the peripheral region of the photoelectric converting portion toward the read channel which is formed in the fourth N-layer 406 formed below the first polysilicon layer 402. This enables a signal charge 408 to be smoothly subjected to drift motion as indicated by the arrows.

In the above description, the four kinds of implantation regions, i.e., the first to fourth N-layers 405 to 406 are set in the photoelectric converting region 401. It should be additionally mentioned that, even when implantation regions are formed by impurity layers of the same kind and of two or more concentrations, or even when a P-type impurity is partly used in the peripheral region of the photoelectric converting portion, the function of producing a monotonous potential gradient in the semiconductor as moving from the peripheral region of the photoelectric converting portion toward the read channel formed below the first polysilicon layer 402 which serves as the read gate can be attained.

Next, a fifth embodiment will be described with reference to FIGS. 9, 10, 11, and 12.

Figure 9:
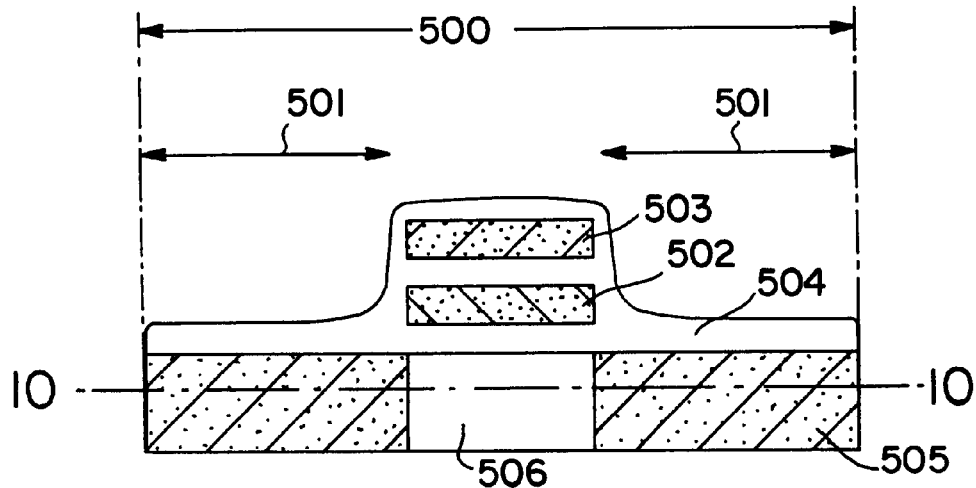
FIG. 9 is a section view of a unit pixel taken in the vertical direction.

FIG. 9 is a section view taken in the depth direction of a substrate along a line which passes a substantially center portion of a unit pixel and elongates in parallel with vertical transferring means. A V pitch 500 indicates the length of the unit pixel. In the figure, shown are a photoelectric converting region 501, a first and second polysilicon layers 502 and 503 which constitutes a read gate via an oxide film 504.

Figure 10:
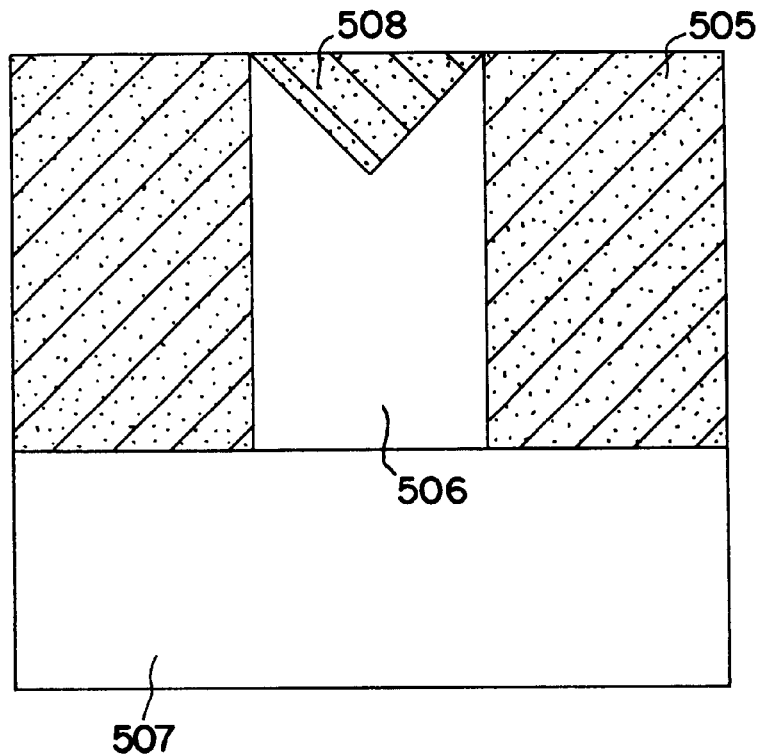
FIG. 10 is a section view of the unit pixel at a depth of X3–X3'.

FIG. 10 is a view showing a section as seen from the top and at a depth of X3–X3' parallel to the surface of the semiconductor, in order to facilitate the understanding of the impurity distribution in the semiconductor. A fifth N-layer 507 constitutes a VCCD which is vertical charge transferring means. A fourth N-layer 506 constitutes a read channel for reading a signal charge generated in the semiconductor substrate of the photoelectric converting region 501, into the fifth N-layer 507 constituting the VCCD.

In the figure, shown are a first N-layer 505, the fourth N-layer 506 formed below the first polysilicon layer 502, and a P-layer 508 which is formed below the first polysilicon layer 501 and has a triangular implantation shape. Because of the existence of the P-layer 508 which has a triangular implantation shape, a subsequent thermal diffusion step causes the impurity concentration of the N-layer to be made higher as moving toward the fifth N-layer 507 forming, the transferring path of the VCCD which is vertical transferring means. Therefore, also the potential in the reading process (in the case where, for example, a read voltage of +15 V is applied to the electrode of the first polysilicon layer 502 as described later) monotonously rises with the result that drift motion from the read channel to the vertical transferring means can be conducted within a short period.

Figure 11:
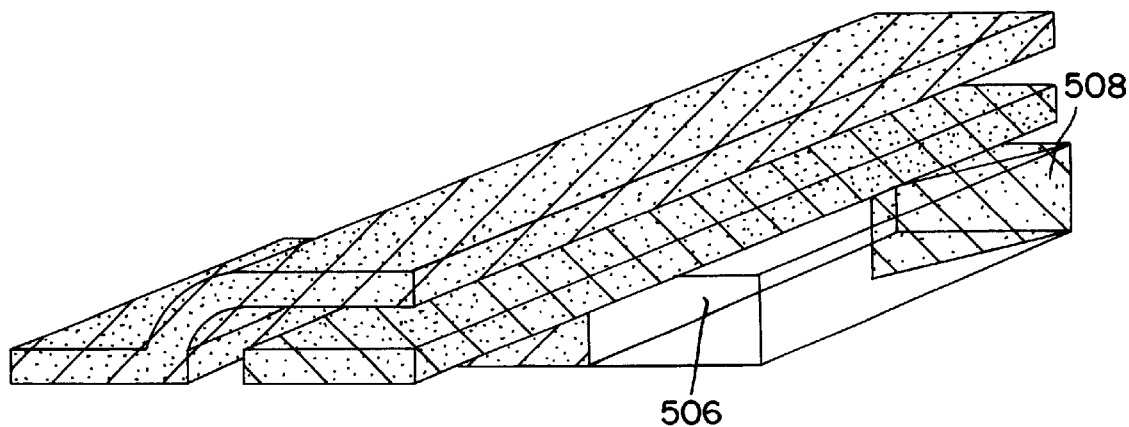
FIG. 11 is a perspective view of the unit pixel.

FIG. 11 is a birds eye view showing an approximately half portion of a unit pixel.

Figure 12:
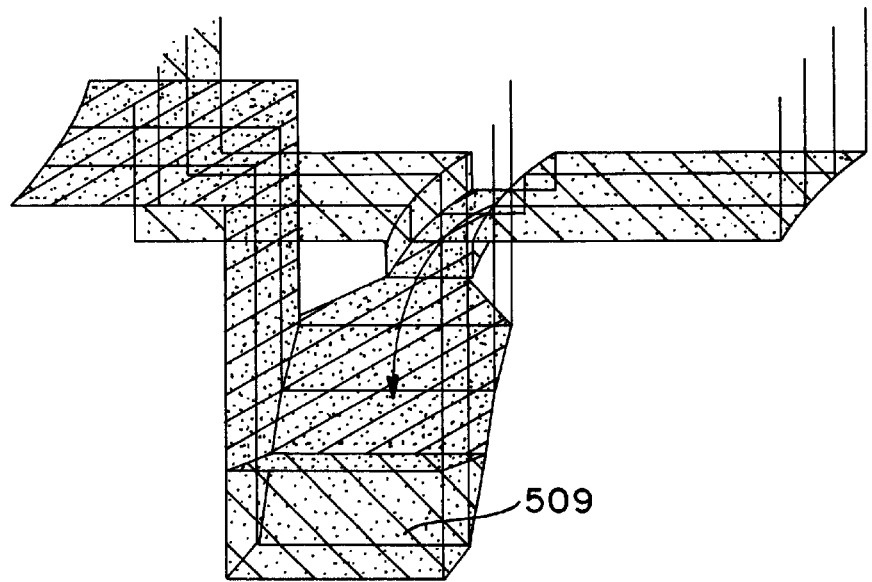
FIG. 12 is a diagram showing a potential distribution of the unit pixel.

FIG. 12 shows the potential distribution in the semiconductor obtained when, in the pixel structure shown in FIGS. 9 and 10, a read voltage is applied to the first polysilicon layer 502 (for example, a read voltage of +15 V is applied to the electrode of the first polysilicon layer 502). At this time, a signal charge moved from the first N-layer 505 which is the peripheral region of the photoelectric converting portion to the read channel which is formed in the fourth N-layer 506 formed below the first polysilicon layer 502 is moved in the direction of the arrow by means of the drift electric field along the monotonous potential gradient which is produced in the channel on the basis of the impurity concentration gradient in the channel.

In the above description, the P-layer 508 is assumed to have a triangular shape of implantation such as ion implantation of a P-type impurity of, for example, boron. It should be emphasized that any implantation shape including a fan-like shape and a trapezoidal shape can exhibit the function of producing a monotonous potential gradient in the read channel formed below the first polysilicon layer 502, as far as the shape causes the width of the implantation region to be made smaller as moving toward the fifth N-layer 507 corresponding to the transferring path of the VCCD.

Next, a sixth embodiment will be described with reference to FIGS. 13, 14, 15, and 16.

Figure 13:
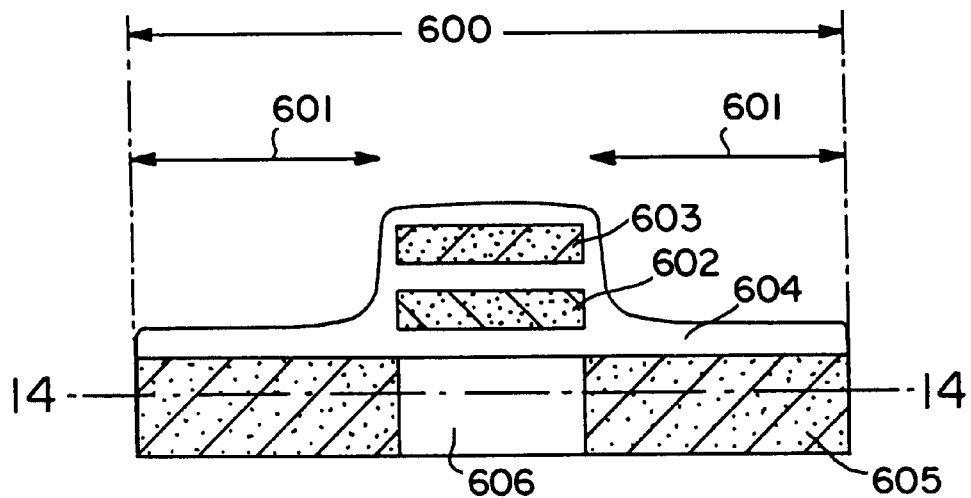
FIG. 13 is a section view of a unit pixel taken in the vertical direction.

FIG. 13 is a section view taken in the depth direction of a substrate along a line which passes a substantially center portion of a unit pixel and elongates in parallel with vertical transferring means. A V pitch 600 indicates the length of the unit pixel. In the figure, shown are a photoelectric converting region 601, first and second polysilicon layers 602 and 603 which constitutes a read gate via an oxide film 604.

Figure 14:
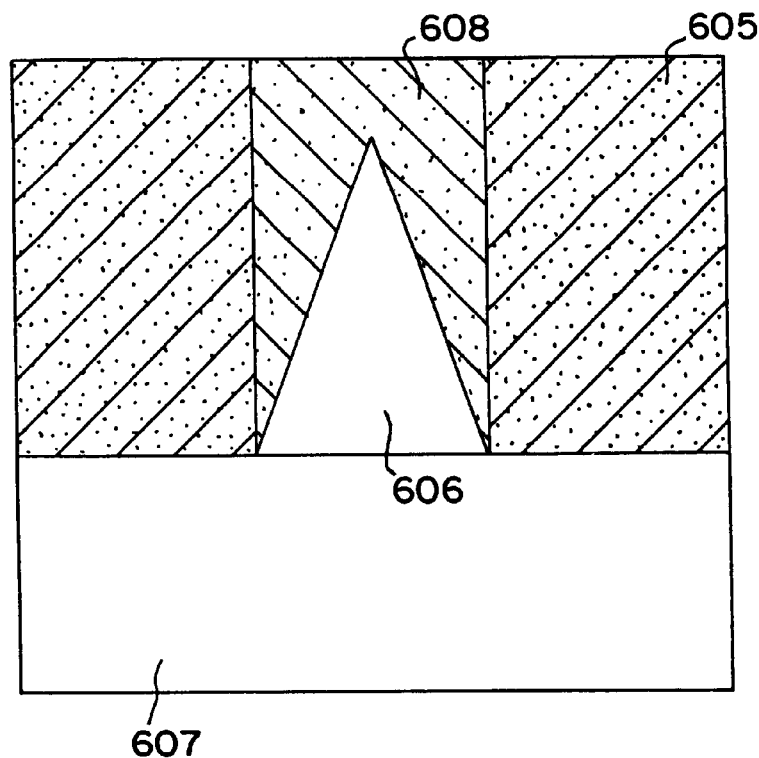
FIG. 14 is a section view of the unit pixel at a depth of X4–X4'.

FIG. 14 is a view showing a section as seen from the top and at a depth of X4–X4' parallel to the surface of the semiconductor, in order to facilitate the understanding of the impurity distribution in the semiconductor. A fifth N-layer 607 constitutes a VCCD which is vertical charge transferring means. A fourth N-layer 606 forms a read channel for reading a signal charge generated in the semiconductor substrate of the first N-layer 605 which is a photoelectric converting region, into the fifth N-layer 607 constituting the VCCD.

In the figure, shown are a first N-layer 605, a P-layer 608 formed below the first polysilicon layer 602, and a fourth N-layer 606 which is formed below the first polysilicon layer 602 and has a triangular implantation shape.

Because the fourth N-layer 606 has a triangular implantation shape, a subsequent thermal diffusion step causes the impurity concentration of the N-layer to be made higher as moving toward the fifth N-layer 607 forming the transferring path of the VCCD which is vertical transferring means. Therefore, also the potential in the reading process (in the case where, for example, a read voltage of +15 V is applied to the electrode of the first polysilicon layer 602 as described later) monotonously rises with the result that drift motion from the first polysilicon layer 602 which is a read gate to the vertical transferring means can be conducted within a short period.

Figure 15:
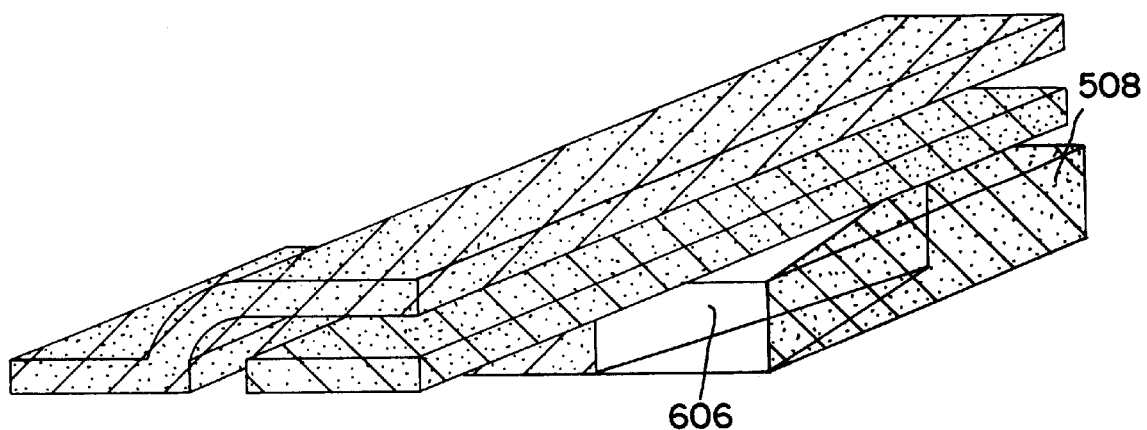
FIG. 15 is a perspective view of the unit pixel.

FIG. 15 is a birds eye view showing an approximately half portion of a unit pixel.

Figure 16:
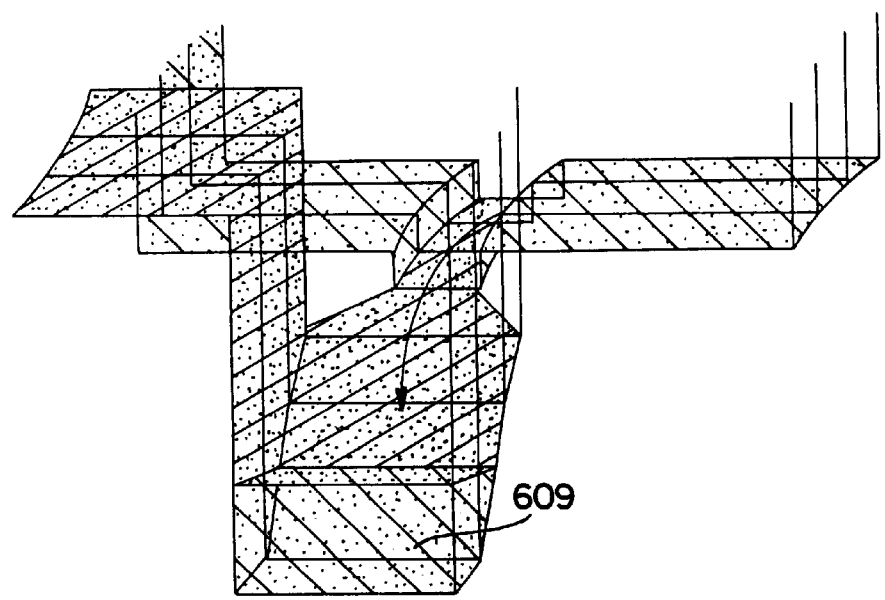
FIG. 16 is a diagram showing a potential distribution of the unit pixel.

FIG. 16 shows the potential distribution in the semiconductor obtained when, in the pixel structure shown in FIGS. 13 and 14, a read voltage is applied to the first polysilicon layer 602 (for example, a read voltage of +15 V is applied to the electrode of the first polysilicon layer 602). At this time, a signal charge moved from the first N-layer 605 which is the peripheral region of the photoelectric converting portion to the read channel which is formed in the fourth N-layer 606 having the triangular implantation shape and formed below the first polysilicon layer 602 is moved in the direction of the arrow by means of the drift electric field along the monotonous potential gradient which is produced in the channel on the basis of the impurity, concentration gradient in the channel.

In the above description, the fourth N-layer 606 is assumed to have a triangular shape of implantation such as ion implantation of an N-type impurity of, for example, phosphorus. It should be emphasized that any implantation shape including an inverse fan-like shape and an inverse trapezoidal shape can exhibit the function of producing a monotonous potential gradient in the read channel formed below the first polysilicon layer 602, as far as the shape causes the width of the implantation region to be made larger as moving toward the fifth N-layer 607 corresponding to the transferring path of the VCCD.

Next, a seventh embodiment will be described with reference to FIGS. 17, 18, 19, and 20.

Figure 17:
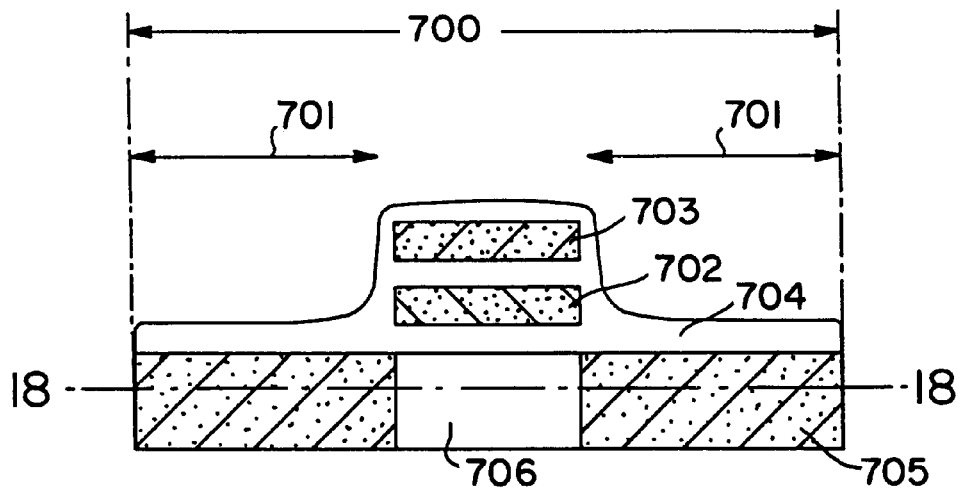
FIG. 17 is a section view of a unit pixel taken in the vertical direction.

FIG. 17 is a section view taken in the depth direction of a substrate along a line which passes a substantially center portion of a unit pixel and elongates in parallel with vertical transferring means. A V pitch 700 indicates the length of the unit pixel. In the figure, shown are a photoelectric converting region 701, first and second polysilicon layers 702 and 703 which constitutes a read gate via an oxide film 704.

Figure 18:
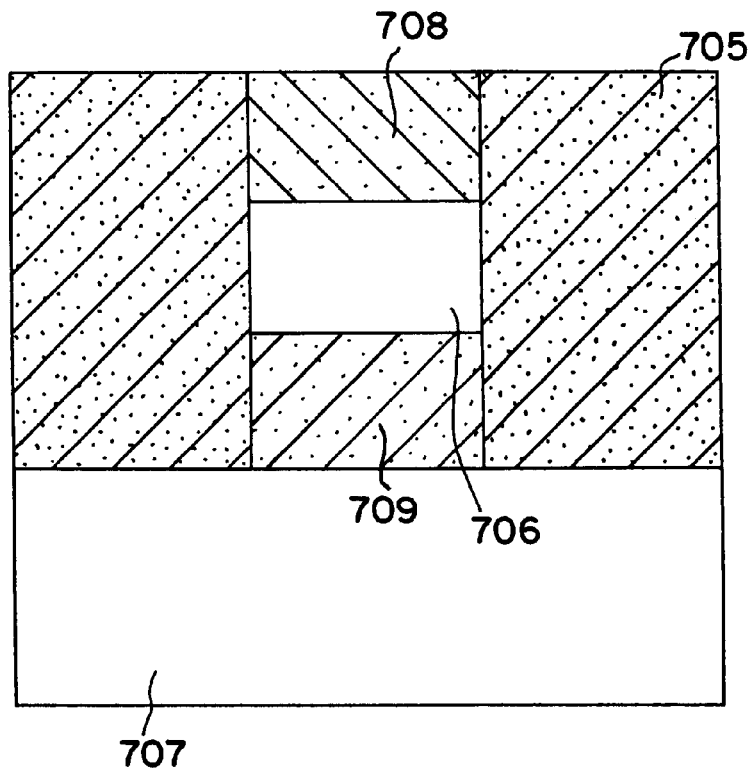
FIG. 18 is a section view of the unit pixel at a depth of X5–X5'.

FIG. 18 is a view showing a section as seen from the top and at a depth of X5–X5' parallel to the surface of the semiconductor, in order to facilitate the understanding of the impurity distribution in the semiconductor. A fifth N-layer 707 constitutes a VCCD which is vertical charge transferring means. Fourth and seventh N-layers 706 and 709 form a read channel for reading a signal charge generated in the semiconductor substrate of the first N-layer 705 which is a photoelectric converting region, into the fifth N-layer 707 constituting the VCCD.

In the figure, a first N-layer 705, a P-layer 708, the fourth N-layer 706, and the seventh N-layer 709 are shown. Impurity implantation typified by ion implantation or the like is conducted so that the impurity concentration of the seventh N-layer is higher than that of the fourth N-layer 706. Therefore, also the potential in the reading process (in the case where, for example, a read voltage of +15 V is applied to the electrode of the first polysilicon layer 702 as described later) monotonously rises with the result that drift motion from the first polysilicon layer 702 which is the read gate to the vertical transferring means can be conducted within a short period.

Figure 19:
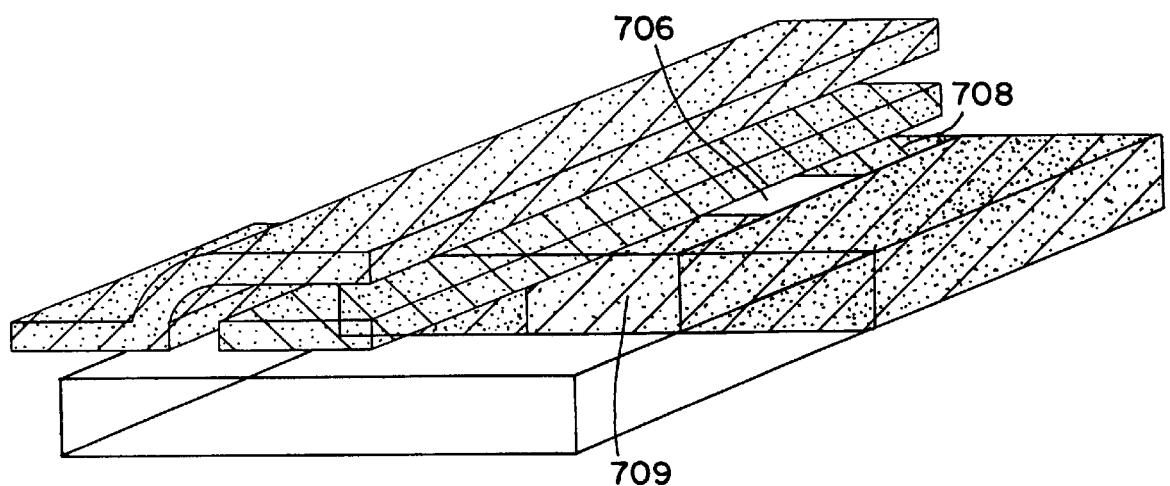
FIG. 19 is a perspective view of the unit pixel.

FIG. 19 is a birds eye view showing an approximately half portion of a unit pixel.

Figure 20:
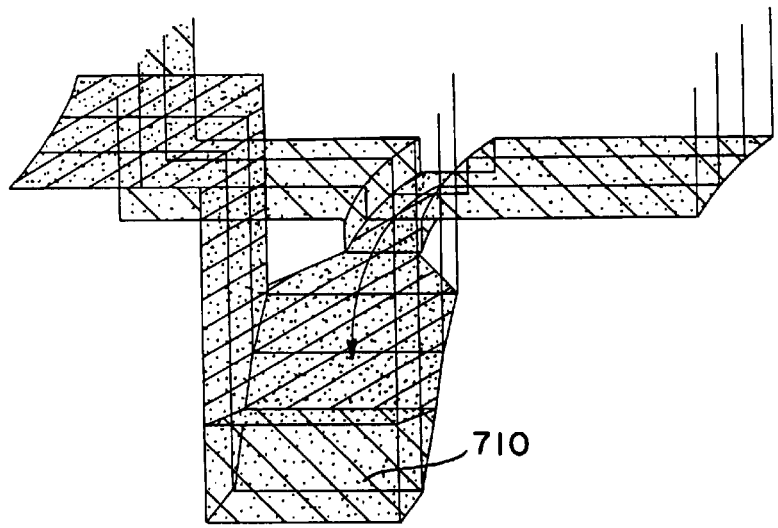
FIG. 20 is a diagram showing a potential distribution of the unit pixel.

FIG. 20 shows the potential distribution in the semiconductor obtained when, in the pixel structure shown in FIGS. 17 and 18, a read voltage is applied to the first polysilicon layer 702 (for example, a read voltage of +15 V is applied to the electrode of the first polysilicon layer 702). At this time, a signal charge moved from the first N-layer 705 which is the peripheral region of the photoelectric converting portion to the read channel which is formed in the fourth N-layer 706 and seventh N-layer 709 formed below the first polysilicon layer 702 is moved in the direction of the arrow by means of the drift electric field along the monotonous potential gradient which is produced in the channel on the basis of the impurity concentration gradient in the channel.

In the above description, it is assumed to use two kinds of N-type impurity ion implantation layers, i.e., the fourth and seventh N-layers 706 and 709. It should be emphasized that, even when more kinds of impurity ion implantation layers are formed below the first polysilicon layer 702, the function of producing a monotonous potential gradient in the read channel can be exhibited by conducting implantation so that the N-type concentration becomes gradually higher.

Next, an eighth embodiment will be described with reference to FIGS. 21, 22, 23, and 24.

Figure 21:
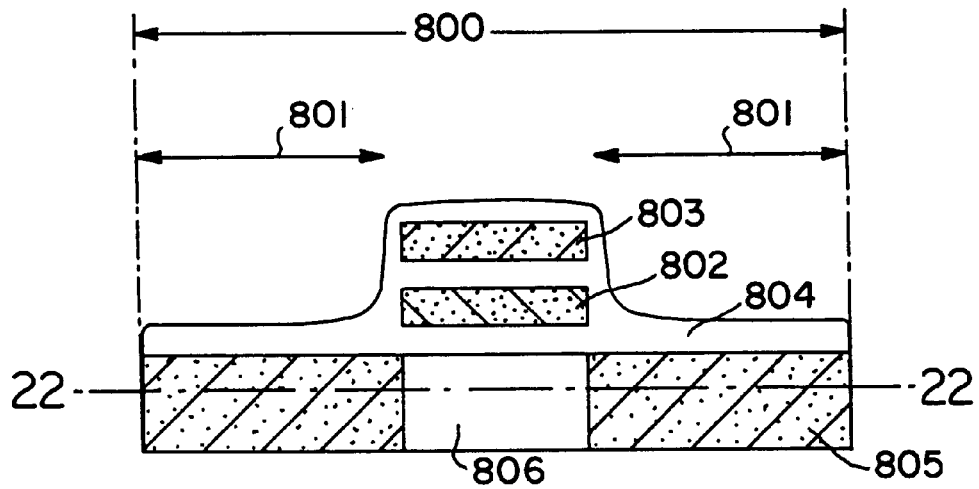
FIG. 21 is a section view of a unit pixel taken in the vertical direction.

FIG. 21 is a section view taken in the depth direction of a substrate along a line which passes a substantially center portion of a unit pixel and elongates in parallel with vertical transferring means. A V pitch 800 indicates the length of the unit pixel. In the figure, shown are a photoelectric converting region 801, first and second polysilicon layers 802 and 803 which constitutes a read, gate via an oxide film 804.

Figure 22:
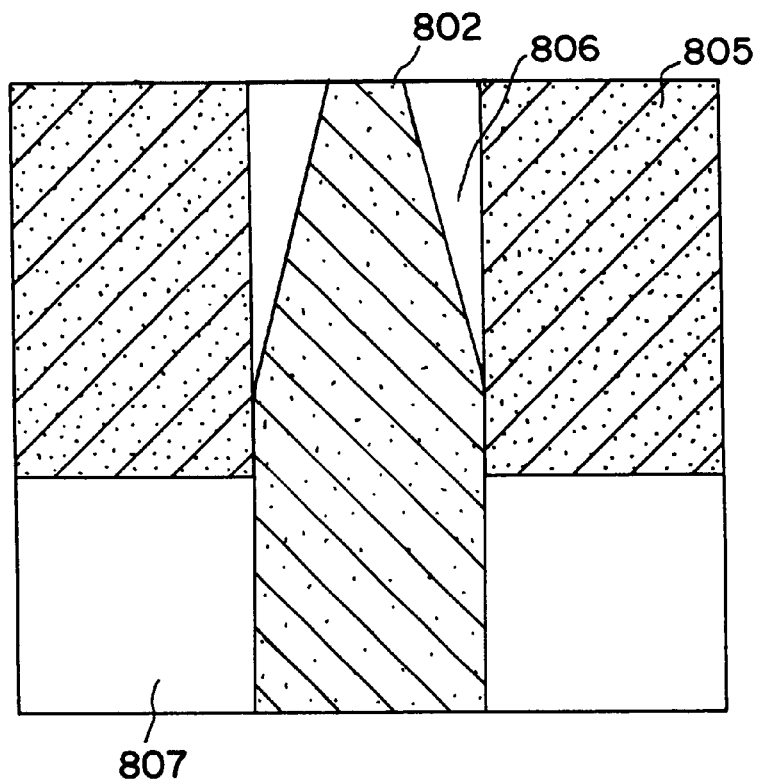
FIG. 22 is a section view of the unit pixel at a depth of X6–X6'.

FIG. 22 is a view showing a section as seen from the top and along the first polysilicon layer parallel to the surface of the semiconductor, in order to facilitate the understanding of the impurity distribution in the semiconductor. A fifth N-layer 807 constitutes a VCCD which is vertical charge transferring means. A fourth N-layer 806 forms a read channel for reading a signal charge generated in the semiconductor substrate of the first N-layer 805 which is a photoelectric converting region, into the fifth N-layer 807 constituting the VCCD.

In the figure, shown are a first N-layer 805, the fourth N-layer 806, and the first polysilicon layer 802. The first polysilicon layer 802 has a shape corresponding to a trapezoidal shape or a wedge-like shape in which the width becomes larger as moving toward the fifth N-layer which is the VCCD. Therefore, also the potential in the reading process (in the case where, for example, a read voltage of +15 V is applied to the electrode of the first polysilicon layer 802 as described later) is caused to monotonously rise by the narrow channel effect, toward the fifth N-layer 807 with the result that drift motion from the first polysilicon layer 802 which is the read gate to the vertical transferring means can be conducted within a short period.

FIG. 23 is a birds eye view showing an approximately half portion of a unit pixel.

FIG. 24 shows the potential distribution in the semiconductor obtained when, in the pixel structure shown in FIGS. 21 and 22, a read voltage is applied to the first polysilicon layer 802 (for example, a read voltage of +15 V is applied to the electrode of the first polysilicon layer 802). At this time, a signal charge moved from the first N-layer 805 which is the peripheral region of the photoelectric converting portion to the read channel which is formed in the fourth N-layer 806 formed below the first polysilicon layer 802 is moved in the direction of the arrow by means of the drift electric field along the monotonous potential gradient which is produced in the channel by the narrow channel effect due to the shape of the first polysilicon layer.

Next, a ninth embodiment will be described with reference to FIGS. 25 and 26.

Figure 25:
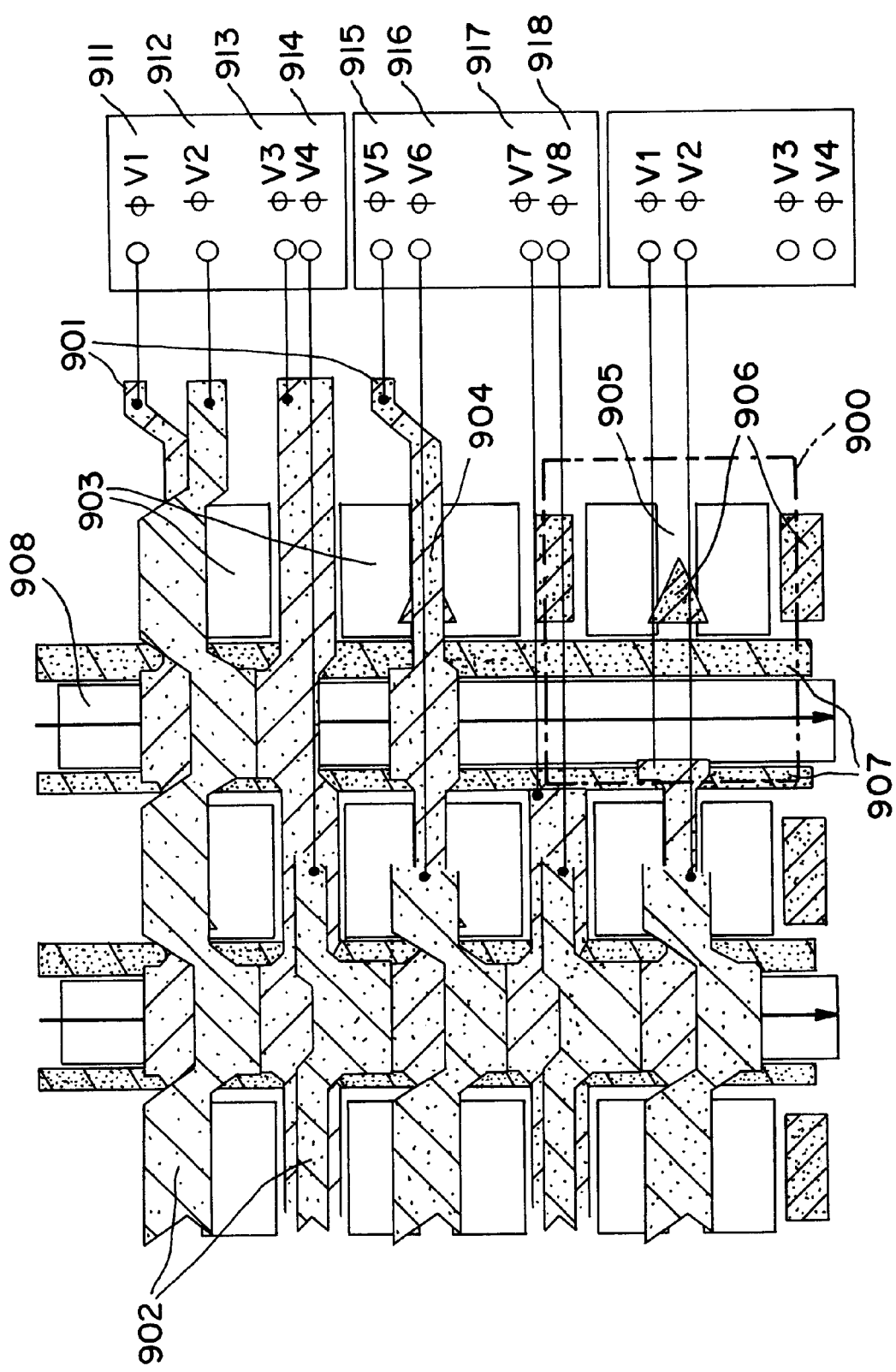
FIG. 25 is a plan view of a solid state imaging device.
Figure 26:
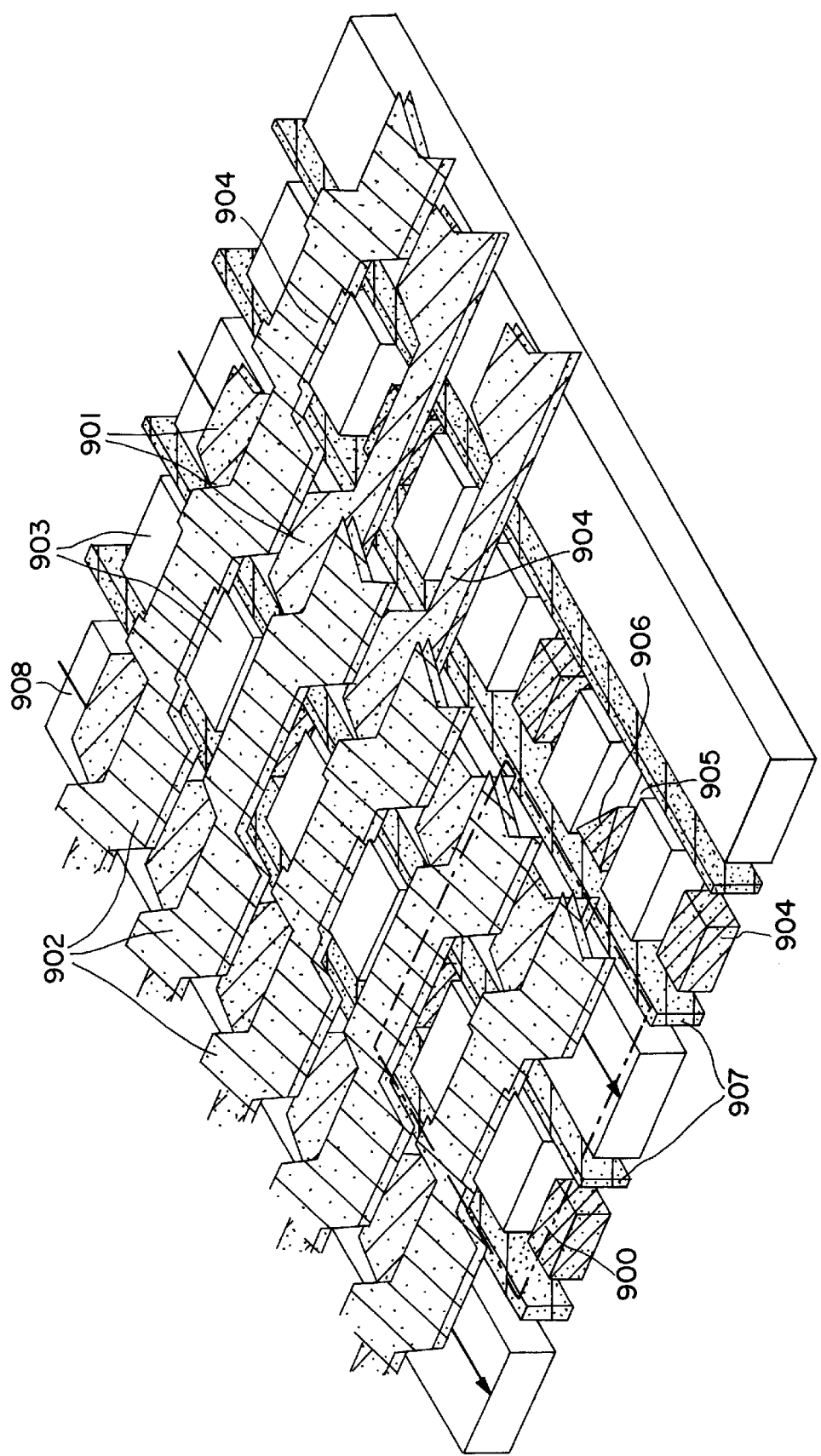
FIG. 26 is a perspective view of the solid state imaging device.

FIGS. 25 and 26 show an example of a two-dimensional solid state imaging device in which the arrangement shown in FIG. 1 is realized by using the unit pixel having the structure shown in FIGS. 9, 10, 11, and 12.

FIG. 25 shows a plan view of a two-dimensionally arrayed solid state imaging device. In order to facilitate the understanding of the internal structure, a part of the device is cut away in such a manner that the degree of the cutting is deeper as moving in the lower right corner in the figure. The components include: a first polysilicon layer 901; a second polysilicon layer 902; a PD (Photodiode) 903 which serves as a photoelectric converting portion; a read gate 904 (which is formed by, for example, the gates of the first and second polysilicon layers); a read channel 905 (in the embodiment, an N-layer) which is formed in a semiconductor below the read gate; a P-layer 906 which prevents a signal charge from erroneously entering a VCCD of a unit pixel adjacent in a horizontal direction; a P-layer 907 which defines the transfer channel region of a VCCD; and a VCCD 908 which transfers a signal charge in the direction of the arrows. A unit pixel 900 is indicated by a region enclosed by a one-dot chain line. In order to drive the two-dimensionally arrayed solid state imaging device, employed are driving pulses of eight phases in total, namely, a driving pulse φV1 911, a driving pulse φV2 912, a driving pulse φV3 913, a driving pulse φV4 914, a driving pulse φV5 915, a driving pulse φV6 916, a driving pulse φV7 917, and a driving pulse φV8 918.

FIG. 26 is a birds eye view of the two-dimensionally arrayed solid state imaging device. In order to facilitate the understanding of the internal structure, a part of the device is cut away in such a manner that the degree of the cutting is deeper as moving in the lower end in the figure. In the embodiment, as described above, the read gate has the structure shown in FIGS. 9, 10, 11, and 12. It is a matter of course that the pixel structures shown in FIGS. 13 to 16, 17 to 20, and 21 to 24 may be used.

Next, a tenth embodiment will be described with reference to FIGS. 27, 28, 29, and 30.

Figure 27:
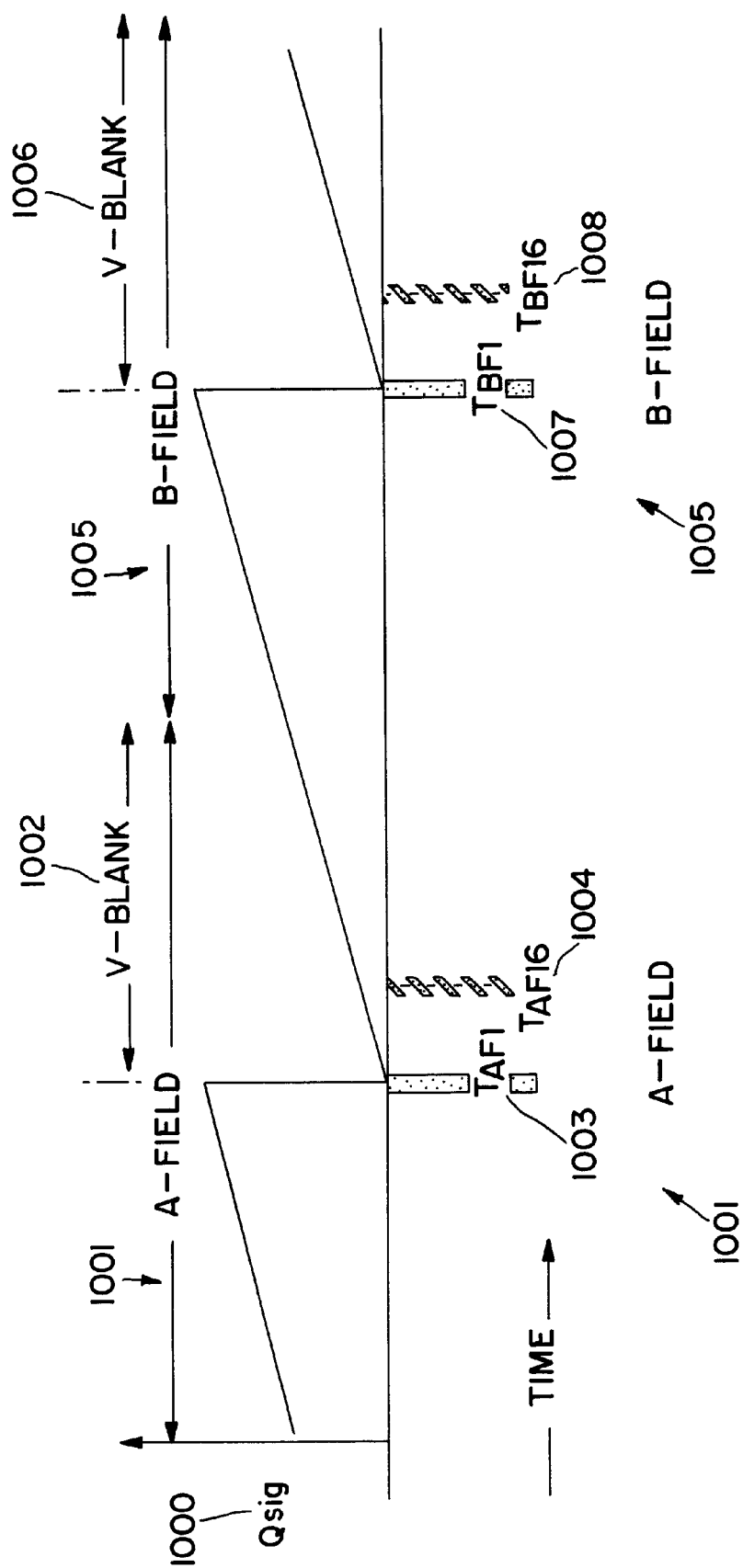
FIG. 27 is a diagram showing temporal variation of accumulated signal charges.
Figure 28B:
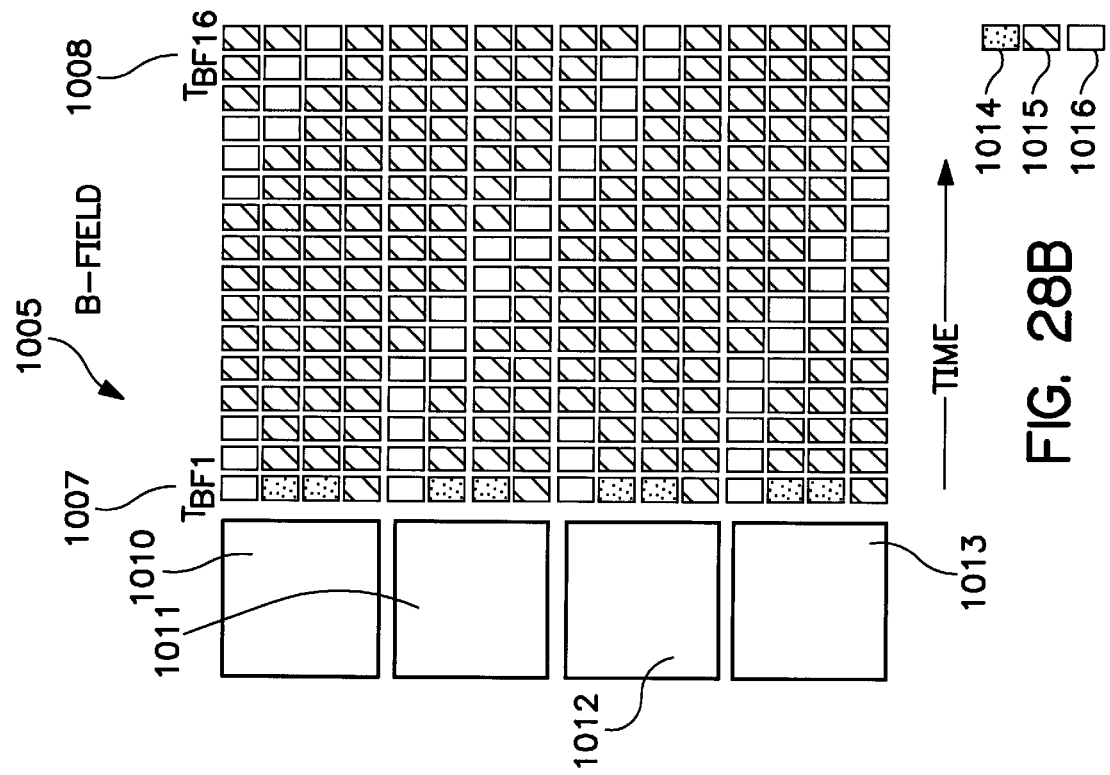
FIG. 28 is a chart of signal charge transfer.
Figure 28A:
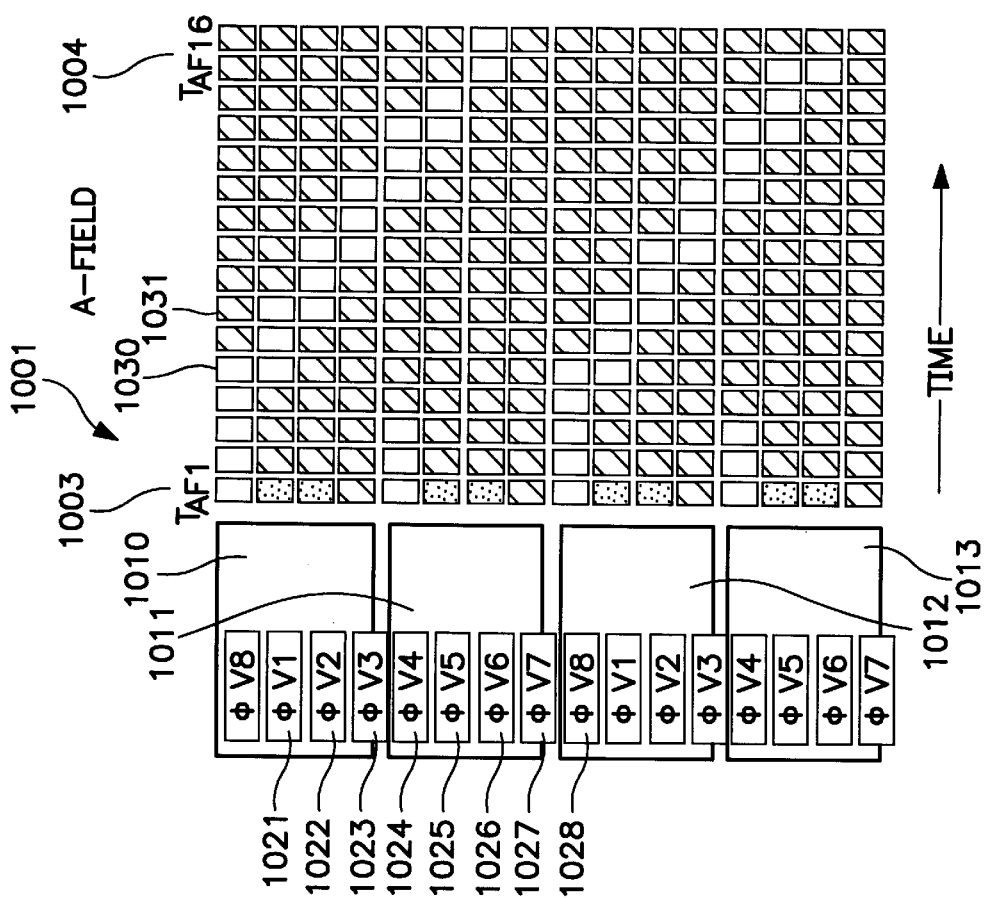
Figure 29:
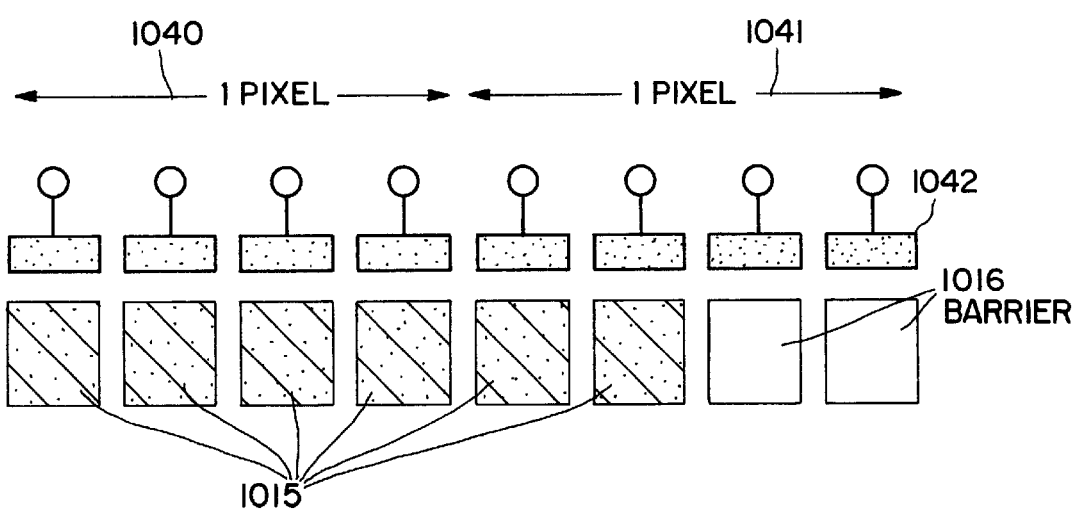
FIG. 29 is a diagram of charge packets.
Figure 30A:
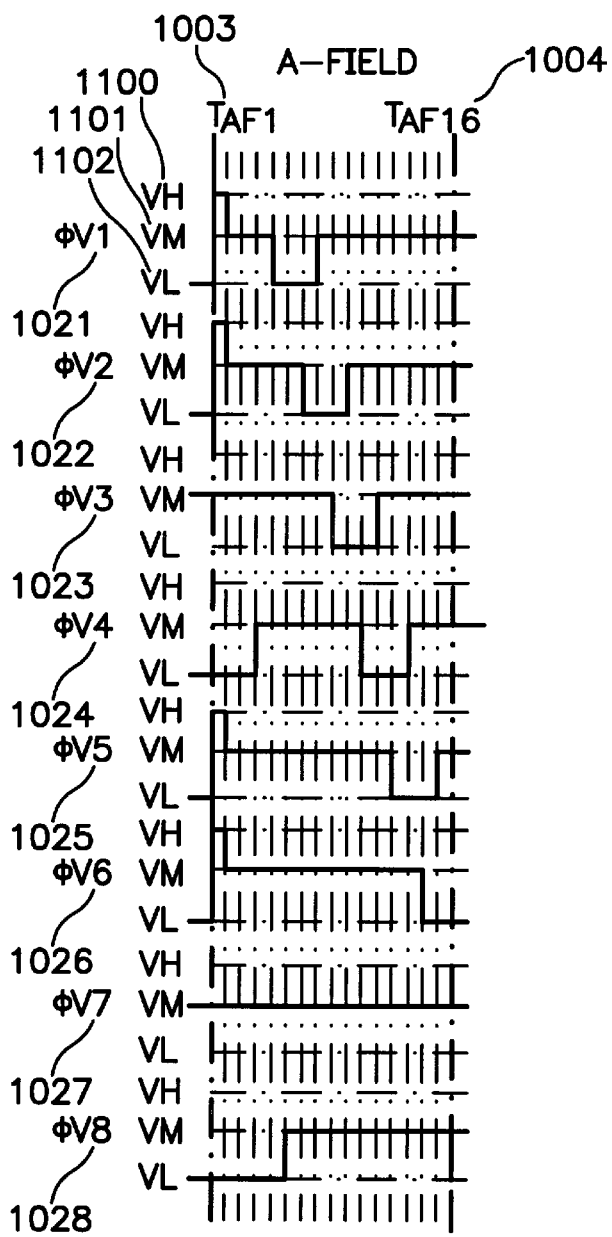
FIG. 30 is a timing chart.
Figure 30B:
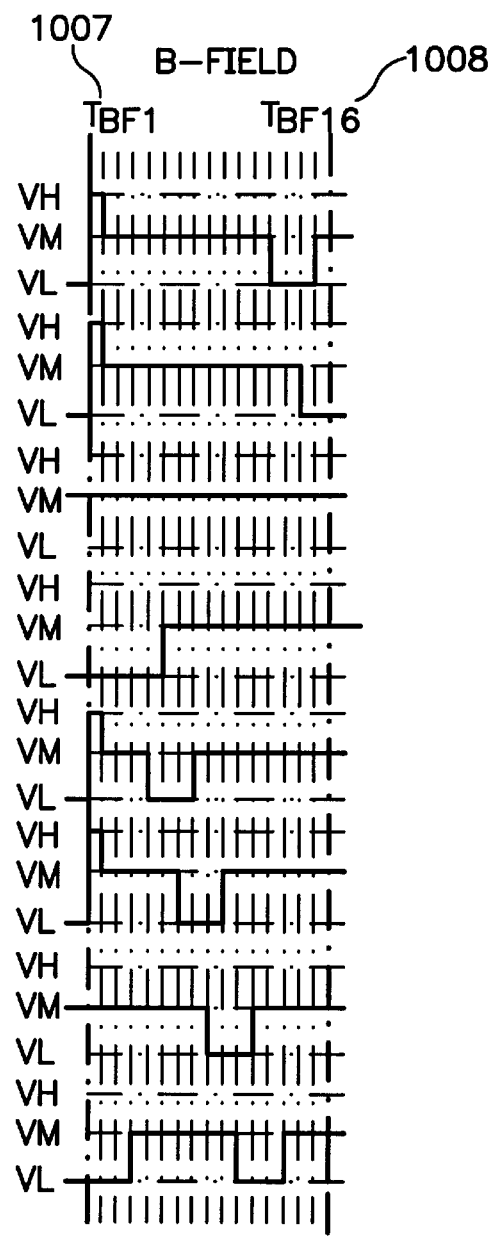

FIGS. 27, 28, and 29 are diagrams showing the transfer of a signal charge, and FIG. 30 shows timing charts. These figures show an example of the operation of reading/transferring a signal charge in a solid state imaging device having an eight-phase electrode structure in a VCCD of a photoelectric converting portion.

FIG. 27 is a diagram showing a time chart in the case where the solid state imaging device having the eight-phase electrode structure shown in FIGS. 25 and 26 is subjected to the reading/transferring operation in a scan mode in accordance with NTSC. In the figure, the abscissa indicates the time, and the ordinate indicates a signal charge amount $Q_{sig}$ 1000 which is subjected to photoelectric conversion and accumulated with respect to light incident in the A-field period 1001 and the B-field period 1005. In the following description, it is assumed that a TAF1 1003 which is a time of reading a signal charge in the A-field period 1001, and a TBF1 1007 which is a time of reading a signal charge in the B-field period 1005 are set to be immediately after the start of the V-blank period in each field. However, it should be emphasized that, in the present proposal, the reading time is not restricted to the above.

FIG. 28 shows an example of the reading/transferring operation in which the two-pixel mixture is conducted. At the left end, indicated are the eight-phase driving pulses which are to be applied to the transfer electrode of the VCCD of each pixel (namely, a driving pulse φV1 1021, a driving pulse φV2 1022, a driving pulse φV3 1023, a driving pulse φV4 1024, a driving pulse φV5 1025, a driving pulse φV6 1026, a driving pulse φV7 1027, and a driving pulse φV8 1028). The figure diagrammatically shows the flow of a series of operations of transferring a signal charge which use a signal charge transfer packet, starting from the reading operation at the TAF1 1003 and ending at a TAF16 1004, in accordance with the elapse of time (in this case, at each clock pulse).

In FIG. 28, each solid square indicates the signal charge reading 1014, each hatched square indicates a signal charge packet 1015, and each hollow square indicates a barrier 1016. In the A-field 1001 shown in the left portion, at an elapse of three clock pulses after the reading operation at the TAF1 1003, pixels 1010 and 1011, and pixels 1012 and 1013 are mixed with each other. In the B-field 1005 shown in the right portion of FIG. 28, the operation is executed in which the pixel 1011 is mixed with the pixel 1012, the pixel 1010 is mixed with a pixel (not shown) immediately above the pixel 1010, and the pixel 1013 is mixed with a pixel (not shown) immediately below the pixel 1013.

Also in the B-field 1005, operations are repeated in a similar manner.

Figure 47:
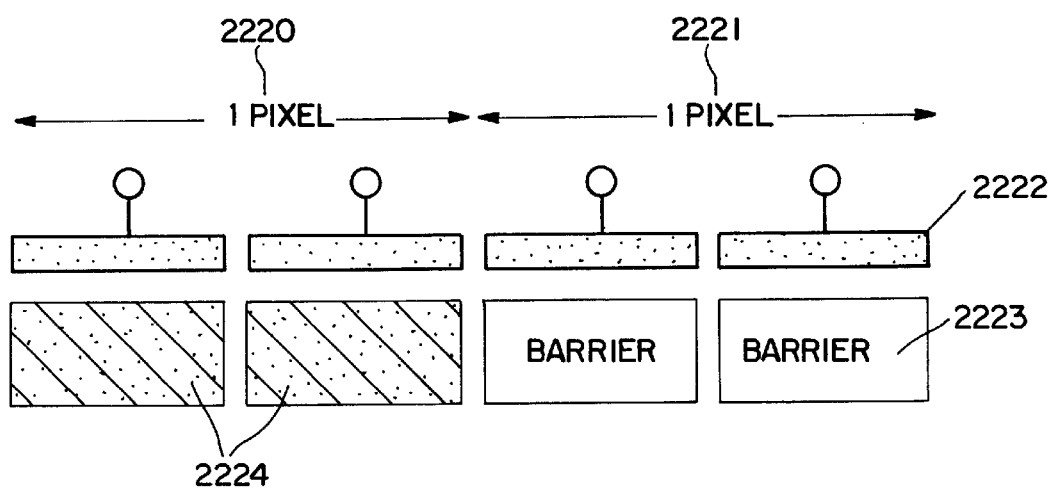
FIG. 47 is a diagram of charge packets.

FIG. 29 shows the packet configuration at TAF5 1030 and TAF7 1031 when the signal charge packet after the two-pixel mixture is minimum in FIG. 28. In each of VCCD lengths 1040 and 1041 corresponding to one pixel, as shown in the figure, there are four VCCD electrodes 1042. In the embodiment, since the eight-phase driving is employed, electrodes in the unit of two pixels (having eight VCCD electrodes in total) can be independently driven. As a result, there are six bundles of signal charge packets 1015 in the signal charge transfer. By contrast, as shown in FIG. 47, in the transfer method of the prior art, VCCDs 2220 and 2221 each corresponding to one pixel have four VCCD electrodes 2222 in total. In order to prevent adjacent signal charge packets from being mixed with each other in the charge transfer, the number of bundles of signal charge packets 2224 in the signal charge transfer is two in view of the fact that a barrier 2223 in the charge transfer requires two electrodes at a minimum. When the area of a VCCD allocated to one pixel is indicated by S, in a prior art CCD, it is possible to ensure an area of 1/2S for the signal charge transfer. With respect to this point, according to the invention, when the VCCD length corresponding to one pixel is assumed to be equal to that of the prior art, an area of 6/8S is used for the signal charge transfer. As a result, when converted into an electrode area for forming a signal charge packet, the increase of the area to 1.5 times that of the prior art can be realized so that the amount of a signal charge which can be transferred is improved.

FIG. 30 shows timing, charts of the eight-phase driving pulses (the driving pulse φV1 1021, the driving pulse φV2 1022, the driving pulse φV3 1023, the driving pulse φV4 1024, the driving pulse φV5 1025, the driving pulse φV6 1026, the driving pulse φV7 1027, and the driving pulse φV8 1028) which enable the signal charge transfer to be executed, during the period from the TAF1 1003 to the TAF16 1004 in the A-field and that from the TBF1 1007 to the TBF1 1008 in the B-field. In this case, it is assumed that voltages of 15 V, 0 V, and −8 V are supplied as VH 1100, VM 1101, and VL 1102, respectively. It should be additionally mentioned that the signal charge transfer of FIG. 28 can be realized without restricting the useful voltages to the three values or two values as described above.

Figure 31:
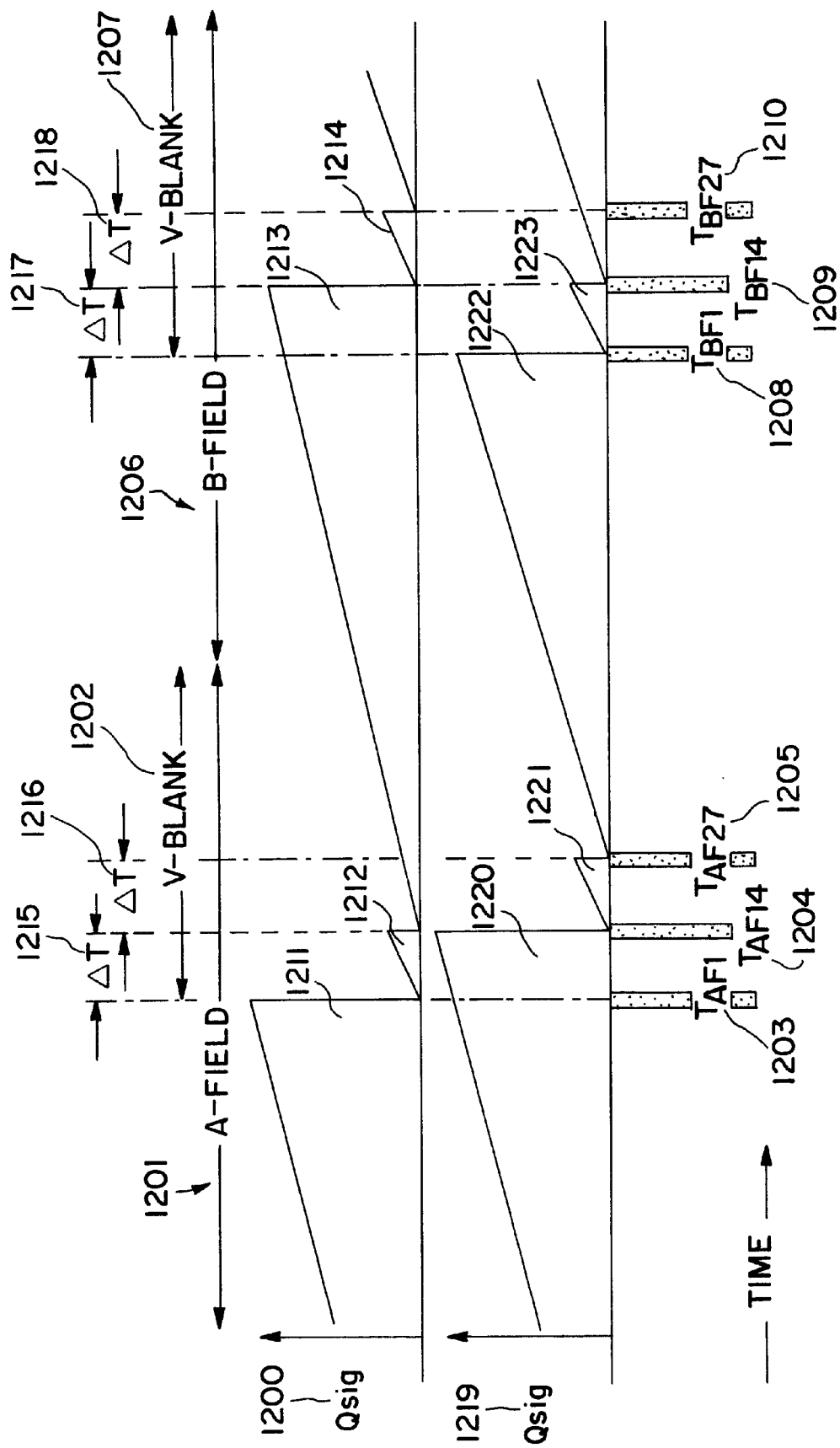
FIG. 31 is a diagram showing temporal variation of accumulated signal charges.

Next, an eleventh embodiment will be described with reference to FIGS. 31, 32, and 33. FIG. 31 is a diagram showing an example of a time chart for conducting two or more imaging processes of long and short accumulation periods in each field in the case where a solid state imaging device having the eight-phase electrode structure shown in FIGS. 25 and 26 is subjected to the reading/transferring operation in a scan mode in accordance with NTSC. It is an object of the embodiment to, in the case where two kinds of accumulation periods or long and short accumulation periods can be set in an arbitrary field period without using an external frame memory, enable the amount of incident light to be estimated from the exposure period and a signal charge amount which is independently obtained by taking an image of an object of low illuminance in the long exposure period, and an image of an object of high illuminance in the short exposure period.

Figures 32A, 32B:
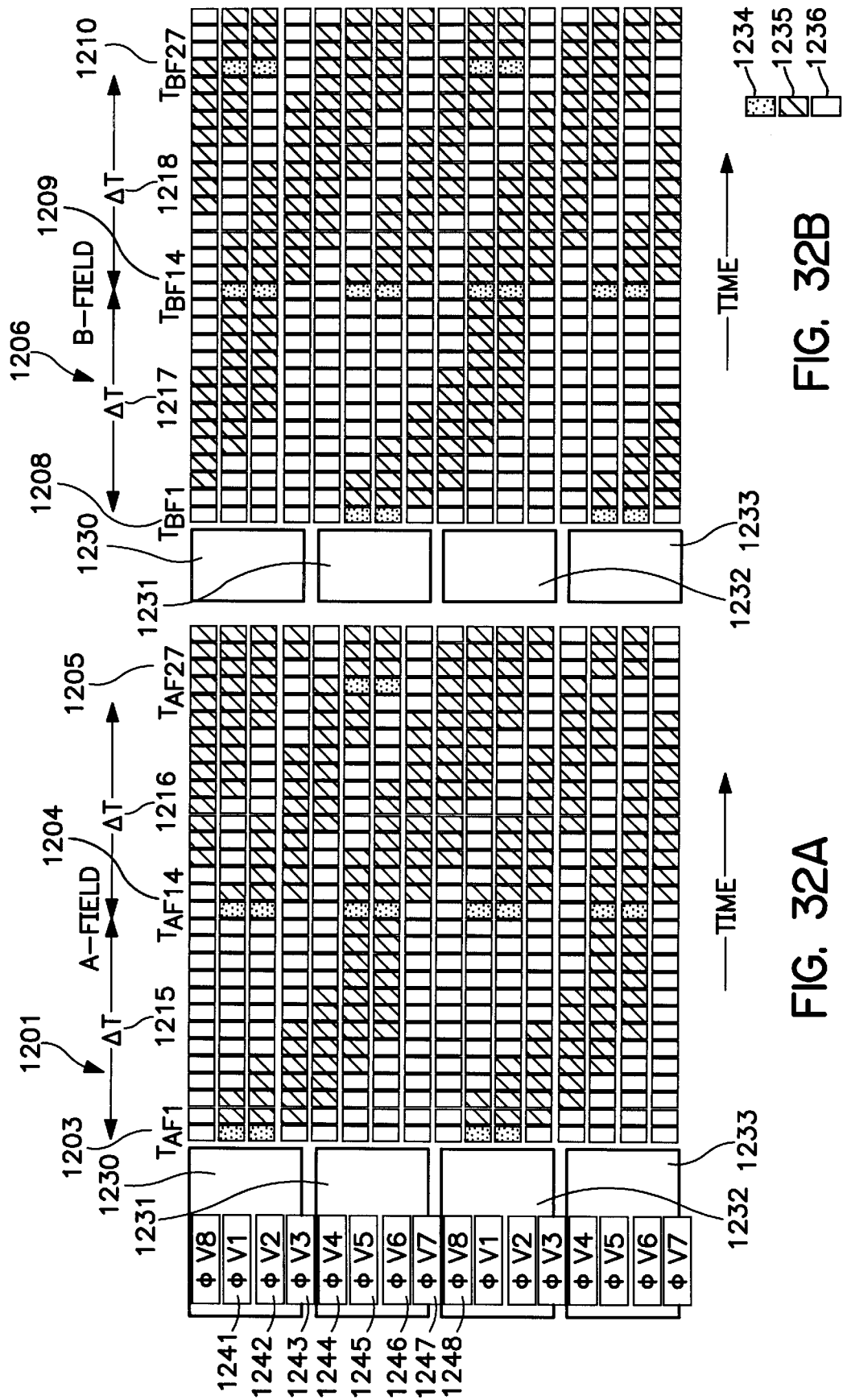
FIG. 32 is a chart of signal charge transfer.

FIG. 32 shows an example of the reading/transferring operation in which the two-pixel mixture is conducted in accordance with the time chart of FIG. 31. At the left end, diagrammatically indicated are pixels representing even- and odd-numbered lines of the solid state imaging device (namely, a pixel 1230, a pixel 1231, a pixel 1232, and a pixel 1233), the transfer electrodes of the VCCDs of the pixels, and the eight-phase driving pulses which are to be applied to the transfer electrodes of the pixels (namely, a driving pulse φV1 1241, a driving pulse φV2 1242, a driving pulse φV3 1243, a driving pulse φV4 1244, a driving pulse φV5 1245, a driving pulse φV6 1246, a driving pulse φV7 1247, and a driving pulse φV8 1248). The figure shows the flow of a series of operations of transferring a signal charge which use a signal charge transfer packet, starting from the reading operation at a TAF1 1203 and ending at an elapse of three clock pulses after a TAF27 1205, in accordance with the elapse of time (in this case, at each clock pulse).

In the chart in the upper portion of FIG. 31, the abscissa indicates the time, and the ordinate indicates the temporal variation of a signal charge amount $Q_{sig}$ 1200 which is subjected to photoelectric conversion and accumulated in a unit pixel of an arbitrary odd-numbered line represented by a pixel 1230 with respect to light incident in each of the A-field period 1201 and the B-field 1206 period. The chart in the lower portion of FIG. 31 shows the temporal variation of a signal charge amount $Q_{sig}$ 1219 which is subjected to photoelectric conversion and accumulated in a pixel 1231 of the next even-numbered line. For the sake of convenience, in the following description, it is assumed that the TAF1 1203 which is a time of reading a signal charge in the A-field period 1201, and a TBF1 1208 which is a time of reading a signal charge in the B-field period 1206 are set to be immediately after the V-blank period in each field. However, it should be emphasized that, in the present proposal, the reading time is not restricted to a timing immediately after the V-blank period.

In the pixel 1230, the reading of a first exposure period A 1211 is conducted at the TAF1 1203 and then the reading is again conducted in the same A-field period or specifically the reading of a second exposure period A 1212 is conducted at a TAF14 1204. In the pixel 1230, furthermore, a signal charge accumulation of a first exposure period B 1213 for conducting the reading at a TBF14 1209 of the B-field is started immediately after the end of the reading at the TAF14 1204. The first exposure period B 1213 is read at the timing of the TBF14 1209 which is delayed from the TBF1 1208 by T 1217, and hence the exposure period is longer than the first exposure period A 1211 by 2 T.

By contrast, in the pixel 1231, the reading of the first exposure period A 1211 is conducted at the TAF14 1204 and then the reading is again conducted in the same A-field period or specifically the reading of a second exposure period A 1221 is conducted at the TAF27 1205. In the pixel 1231, furthermore a signal charge accumulation of a first exposure period B 1222 for conducting the reading at a TBF1 1208 of the B-field is started immediately after the end of the reading at the TAF27 1205. The first exposure period B 1222 is read at the timing of the TBF1 1208, and hence the exposure period is shorter than the first exposure period A 1211 by 2 T. As a result, the first exposure period B 1213 and a first exposure period A 1220 are equal to each other, and the first exposure period A 1211 and the first exposure period B 1222 are equal to each other, but the first exposure period A 1211 and the first exposure period B 1213 are different from each other by 2 T.

This does not produce a problem when T is so short as to be negligible as compared with the first exposure period A 1211. When T is so long as not to be negligible, the exposure periods must be made virtually equal to each other through a calculation process of conducting conversion using the ratio of the periods.

The second exposure period A 1212, a second exposure period B 1214, the second exposure period A 1221, and a second exposure period B 1223 are set so as to have the same exposure period of T.

The description will be made with reference to FIG. 32. In the figure, each solid square indicates the signal charge reading 1234, each hatched square indicates a signal charge packet 1235, and each hollow square indicates a barrier 1236.

A signal charge of the pixel 1230 and obtained in the first exposure period A 1211 is read at the time of the TAF1 1203 into the VCCD which is the vertical charge transferring means. The signal is then transferred to the position of the pixel 1231 in the VCCD, and, at the timing when a signal charge of the pixel 1231 and obtained in the first exposure period A 1220 is read at the time of the TAF14 1204, is added and mixed in the VCCD.

By contrast, a signal charge of the pixel 1230 and obtained in the second exposure period A 1212 is read at the time of the TAF14 1204 into the VCCD which is the vertical charge transferring means. The signal is then transferred to the position of the pixel 1231 in the VCCD, and, at the timing when a signal charge of the pixel 1231 and obtained in the second exposure period A 1221 is read at the time of the TAF27 1205, is added and mixed in the VCCD.

Also in the B-field 1206, operations are repeated in a similar manner. As a result, the second exposure periods are made equal to each other in each of the A- and B-fields.

In the embodiment, the number of signal charge packets for signal charges obtained in each of the first and second exposure periods is set to be two. The number is not particularly restricted to this value. Alternatively, a combination of one packet and three packets may be used, or that of three packets and one packet may be used. In FIG. 32, T 1215, T 1216, T 1217, and T 1218 are indicated so as to correspond to 13 clock pulses on the reference clock signal base. However, it should be emphasized that, when the transfer is not conducted or the transfer in the reverse direction is partly used, the device can be sufficiently used so as to attain a variation larger than 13 clock pulses.

Figure 33A:
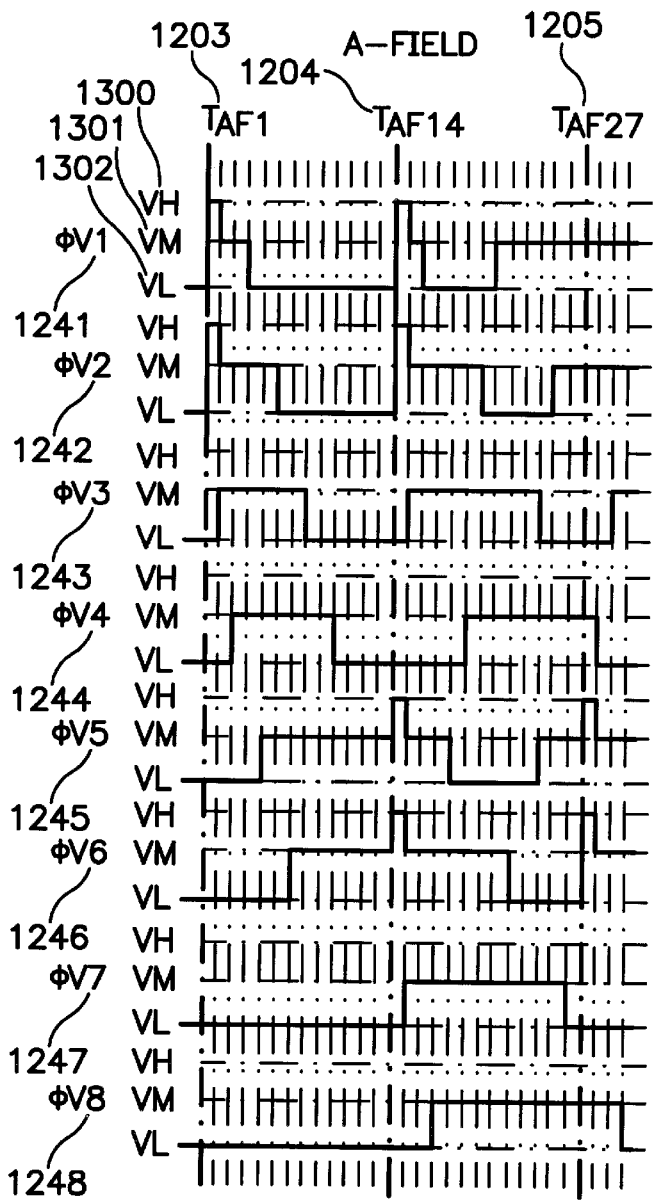
FIG. 33 is a timing chart.
Figure 33B:
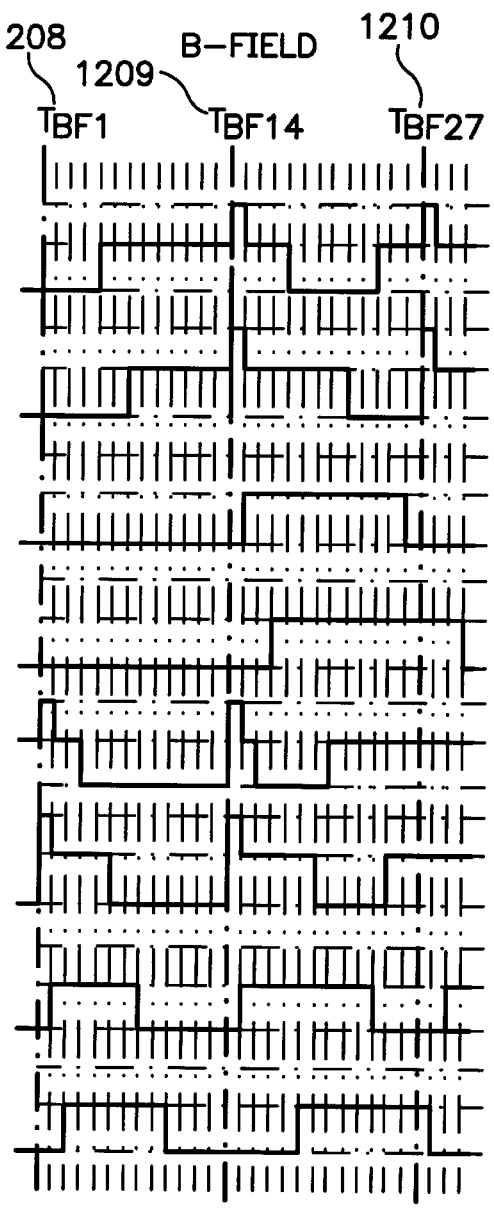

FIG. 33 shows timing charts of the eight-phase driving pulses (the driving pulse φV1 1241, the driving pulse φV2 1242, the driving pulse φV3 1243, the driving pulse φV4 1244, the driving pulse φV5 1245, the driving pulse φV6 1246, the driving pulse φV7 1247, and the driving pulse φV8 1248) which enable the signal charge transfer to be executed, during the period from the TAF1 1203 to an elapse of three clock pulses after the TAF27 1205 in the A-field and that from the TBF1 1208 to an elapse of three clock pulses after the TBF27 1210 in the B-field. In this case, it is assumed that voltages of 15 V, 0 V, and −8 V are supplied as VH 1300, VM 1301, and VL 1302, respectively. It should be additionally mentioned that the signal charge transfer of FIG. 32 can be realized without restricting the useful voltages to the three values as described above.

When converted into the number of horizontal scanning lines, the first exposure periods A 1211 and 1220 in the A-field correspond to about 240 scanning lines, and the second exposure periods A 1212 and 1221 in the V-blank period correspond to about 20 scanning lines. Therefore, the ratio of exposure periods which can be executed is about 8% or less.

Next, a twelfth embodiment will be described with reference to FIGS. 34, 35, and 36.

Figure 34:
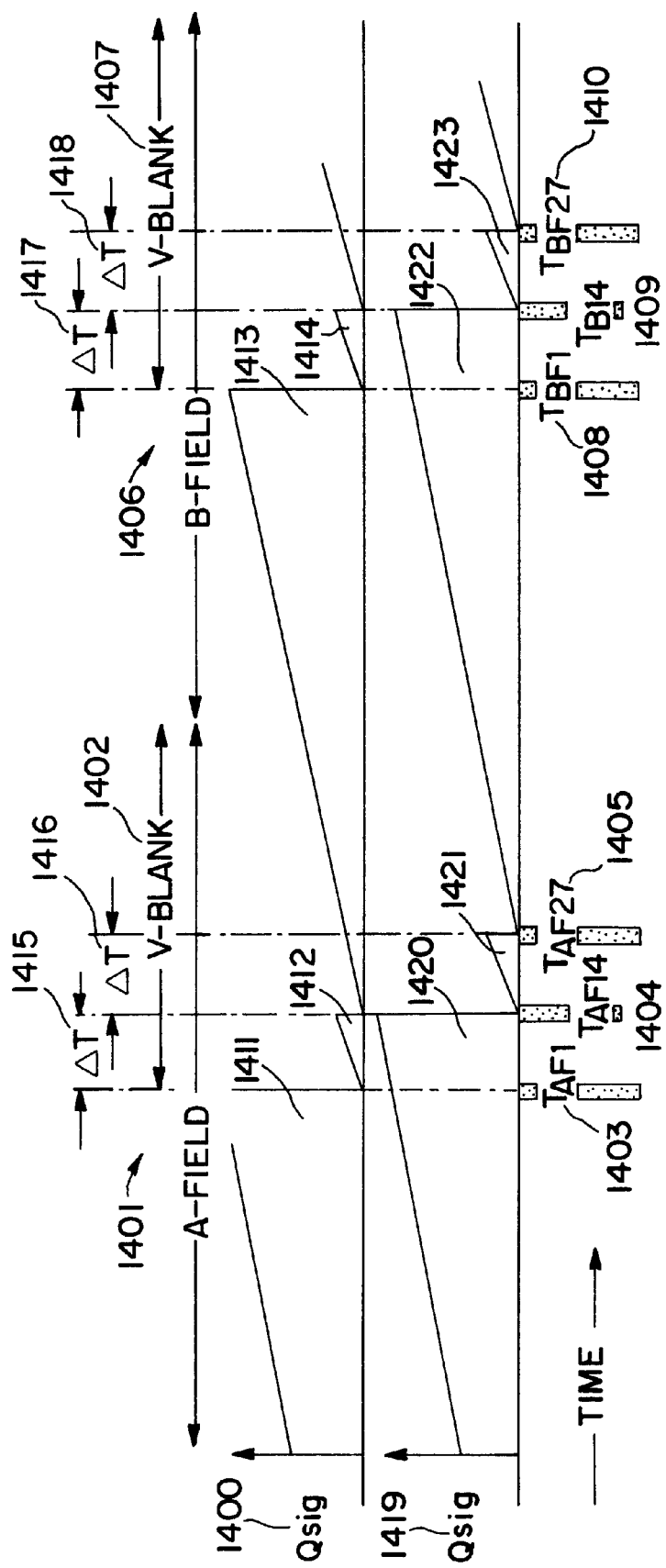
FIG. 34 is a diagram showing temporal variation of accumulated signal charges.

FIG. 34 is a diagram showing a modification of the system of FIGS. 31 and 32 or more specifically a driving method in which a first exposure period A 1411 in the A-field and a first exposure period B 1413 in the B-field are made equal to each other. It is an object of the embodiment to, in the case where two kinds of accumulation periods or long and short accumulation periods can be set in an arbitrary field period without using an external frame memory, respectively equalize long and short exposure periods in the A-field period with those in the B-field period in order to enable the amount of incident light to be estimated from the exposure period and a signal charge amount which is independently obtained by taking an image of an object of low illuminance in the long exposure period, and an image of an object of high illuminance in the short exposure period, thereby facilitating subsequent signal processing. FIG. 35 shows an example of the reading/transferring operation in which the two-pixel mixture is conducted in accordance with the time chart of FIG. 34. At the left end, diagrammatically indicated are pixels representing even- and odd-numbered lines of the solid state imaging device (namely, a pixel 1430, a pixel 1431, a pixel 1432, and a pixel 1433), the transfer electrodes of the VCCDs of the pixels, and the eight-phase driving pulses which are to be respectively applied to the transfer electrodes (namely, a driving pulse φV1 1441, a driving pulse φV2 1442, a driving pulse φV3 1443, a driving pulse φV4 1444, a driving pulse φV5 1445, a driving pulse φV6 1446, a driving pulse φV7 1447, and a driving pulse φV8 1448). The figure shows the flow of a series of operations of transferring a signal charge which use a signal charge transfer packet, starting from the reading operation at a TAF1 1403 and ending at an elapse of three clock pulses after a TAF27 1405, in accordance with the elapse of time (in this case, at each clock pulse).

In the chart in the upper portion of FIG. 34, the abscissa indicates the time, and the ordinate indicates the temporal variation of a signal charge amount $Q_{sig}$ 1400 which is subjected to photoelectric conversion and accumulated in a unit pixel of an arbitrary odd-numbered line represented by a pixel 1430 with respect to light incident in each of the A-field period 1401 and the B-field period 1406. The chart in the lower portion of FIG. 34 shows the temporal variation of a signal charge amount $Q_{sig}$ 1419 which is subjected to photoelectric conversion and accumulated in a unit pixel 1431 of the next even-numbered line. For the sake of convenience, in the following description, it is assumed that the TAF1 1403 which is a time of reading a signal charge in the A-field period 1401, and a TBF1 1408 which is a time of reading a signal charge in the B-field period 1406 are set to be immediately after the V-blank period in each field. However, it should be emphasized that, in the present proposal, the reading time is not particularly restricted to a timing immediately after the V-blank period.

In the pixel 1430, the reading of a first exposure period A 1411 is conducted at the TAF1 1403 and then the reading is again conducted in the same A-field period or specifically the reading of a second exposure period A 1412 is conducted at a TAF14 1404. In the pixel 1430, furthermore, a signal charge accumulation of a first exposure period B 1413 for conducting the reading at the TBF1 1408 of the B-field is started immediately after the end of the reading at the TAF14 1404. The first exposure period B 1413 is read at the timing of the TBF1 1408, and hence the exposure period which is equal to the first exposure period A 1411 can be obtained.

By contrast, in the pixel 1431, the reading of the first exposure period A 1420 is conducted at the TAF14 1404 and then the reading is again conducted in the same A-field period or specifically the reading of a second exposure period A 1421 is conducted at the TAF27 1405. In the pixel 1431, furthermore, a signal charge accumulation of a first exposure period B 1422 for conducting the reading at a TBF1 1409 of the B-field is started immediately after the end of the reading at the TAF27 1405. The first exposure period B 1422 is read at the timing of the TBF14 1409, and hence the exposure period which is equal to the first exposure period A 1420 can be obtained. As a result, the four exposure periods, i.e., the first exposure period B 1413, the first exposure period A 1420, the first exposure period A 1411, and the first exposure period B 1422 are equal to each other.

In the embodiment, the four exposure periods, i.e., the second exposure period A 1412, the second exposure period B 1414, the second exposure period A 1421, and the second exposure period B 1423 are set so as to have the same exposure time of T.

The description will be made with reference to FIG. 35. In the figure, each solid square indicates the signal charge reading 1434, each hatched square indicates a signal charge packet 1435, and each hollow square indicates a barrier 1436.

In the A-field 1401, a signal charge of the pixel 1432 and obtained in the first exposure period A 1411 is read at the time of the TAF1 1403 into the VCCD which is the vertical charge transferring means. The signal is then transferred in the reverse direction to the position of the pixel 1431 in the VCCD, and, at the timing when a signal charge obtained in the first exposure period A 1420 is read form the pixel 1431 at the time of the TAF14 1404, is added and mixed in the VCCD.

By contrast, a signal charge of the pixel 1432 and obtained in the second exposure period A 1412 is read at the time of the TAF14 1404 into the VCCD which is the vertical charge transferring means. The signal is then transferred in the reverse direction to the position of the pixel 1431 in the VCCD, and, at the timing when a signal charge obtained in the second exposure period A 1421 is read from the pixel 1431 at the time of the TAF27 1405, is added and mixed in the VCCD. Thereafter, the signal is transferred in the forward direction.

Also, in the B-field 1406, similarly, a signal charge of the pixel 1430 and obtained in the first exposure period B 1413 is read at the time of the TBF1 1408 into the VCCD which is the vertical charge transferring means. The signal is then transferred in the forward direction to the position of the pixel 1431 in the VCCD, and, at the timing when a signal charge obtained in the first exposure period B 1422 is read from the pixel 1431 at the time of the TBF14 1409, is added to and mixed with the signal charge in the VCCD. By contrast, a signal charge of the pixel 1430 and obtained in the second exposure period B 1414 is read at the time of the TBF14 1409 into the VCCD which is the vertical charge transferring means. The signal is then transferred in the forward direction to the position of the pixel 1431 in the VCCD, and, at the timing when a signal charge obtained in the second exposure period B 1423 is read from the pixel 1431 at the time of the TBF27 1410, is added and mixed with the signal charge in the VCCD. The signal charges read into the VCCD in the B-field are transferred in the reverse direction to a TBF43 1425 and the forward transfer is then started. The same operations are repeated in each field.

As a result, in each of the A- and B-fields, the temporal positioning of the reading and the sequence of reading the lines is conducted during the 43-clock pulse period from the TAF1 1403 to the TAF43 1424 and the 43-clock pulse period from the TBF1 1408 to the TBF43 1425, so that all the firsthand second exposure periods are made equal to each other.

In the embodiment, the number of signal charge packets for signal charges obtained in each of the first and second exposure periods is set to be two. The number is not particularly restricted to this value. Alternatively, a combination of one packet and three packets may be used, or that of three packets and one packet may be used. In FIG. 35, T 1415, T 1416, T 1417, and T 1418 are indicated so as to correspond to 13 clock pulses on the reference clock signal base. However, it should be emphasized that, when the transfer is not conducted or the transfer in the reverse direction is partly used, the device can be sufficiently operated without restricting the period to 13 clock pulses. The timing of entering the forward transfer is set to be the TAF43 1424 and the TBF43 1425 or the 43rd clock pulse on the reference clock signal base counted from the first reading. It is a matter of course that, even when the timing is not set to be the 43rd clock pulse, the signal charge transfer can be realized.

FIG. 36 shows timing charts of the eight-phase driving pulses (the driving pulse $\phi$V1 1441, the driving pulse $\phi$V2 1442, the driving pulse $\phi$V3 1443, the driving pulse $\phi$V4 1444, the driving pulse $\phi$V5 1445, the driving pulse $\phi$V6 1446, the driving pulse $\phi$V7 1447, and the driving pulse $\phi$V8 1448) which enable the signal charge transfer to be executed, during the period from the TAF1 1403 to an elapse of three clock pulses after the TAF27 1405 in the A-field and that from the TBF1 1408 to an elapse of three clock pulses after the TBF27 1410 in the B-field. In this case, it is assumed that voltages of 15 V, 0 V, and −8 V are supplied as VH 1500, VM 1501, and VL 1502, respectively. It should be additionally mentioned that the signal charge transfer of FIG. 35 can be realized without restricting the useful voltages to the three values as described above.

Next, a thirteenth embodiment will be described with reference to FIGS. 37 and 38.

Figure 37:
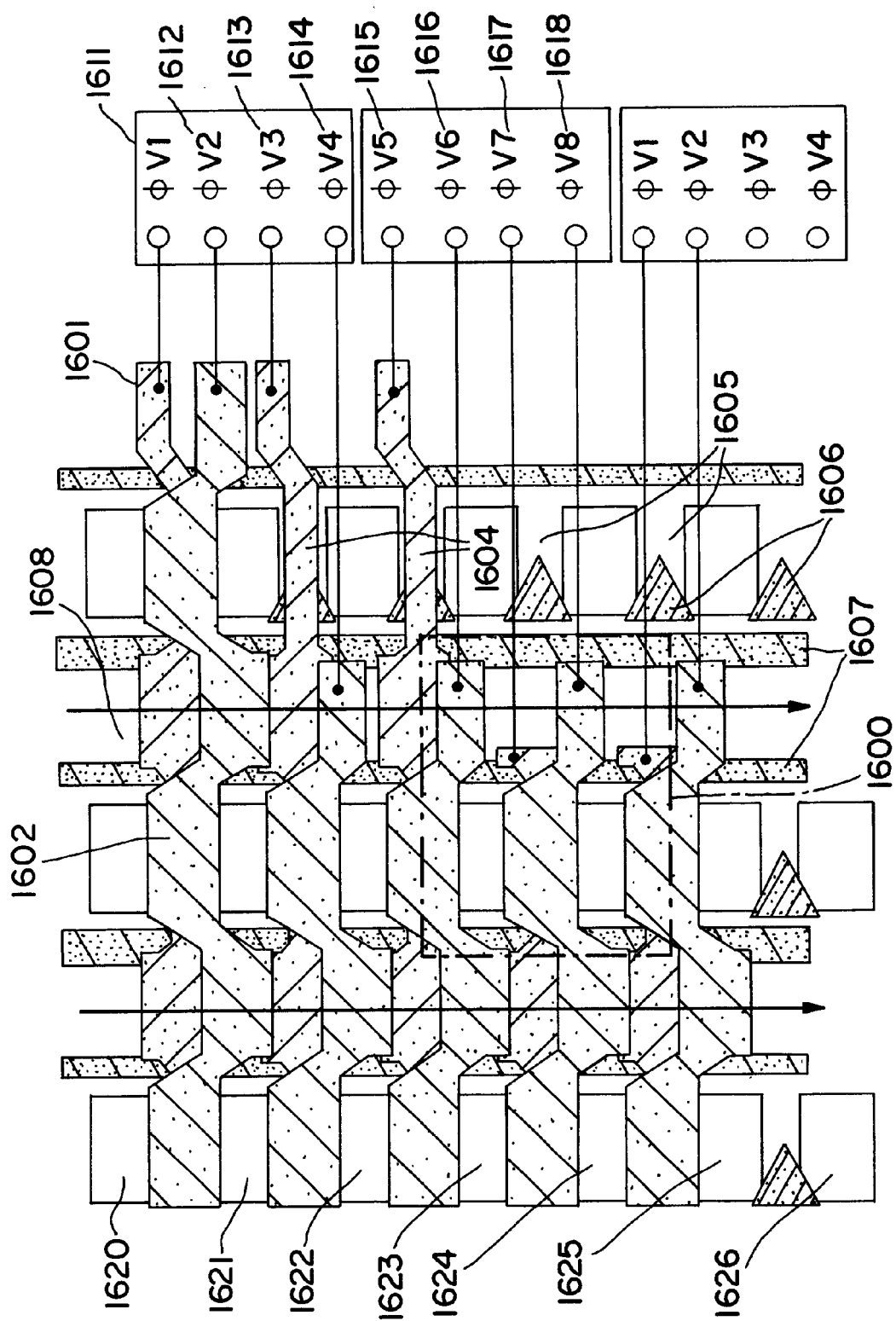
FIG. 37 is a plan view of a solid state imaging device.
Figure 38:
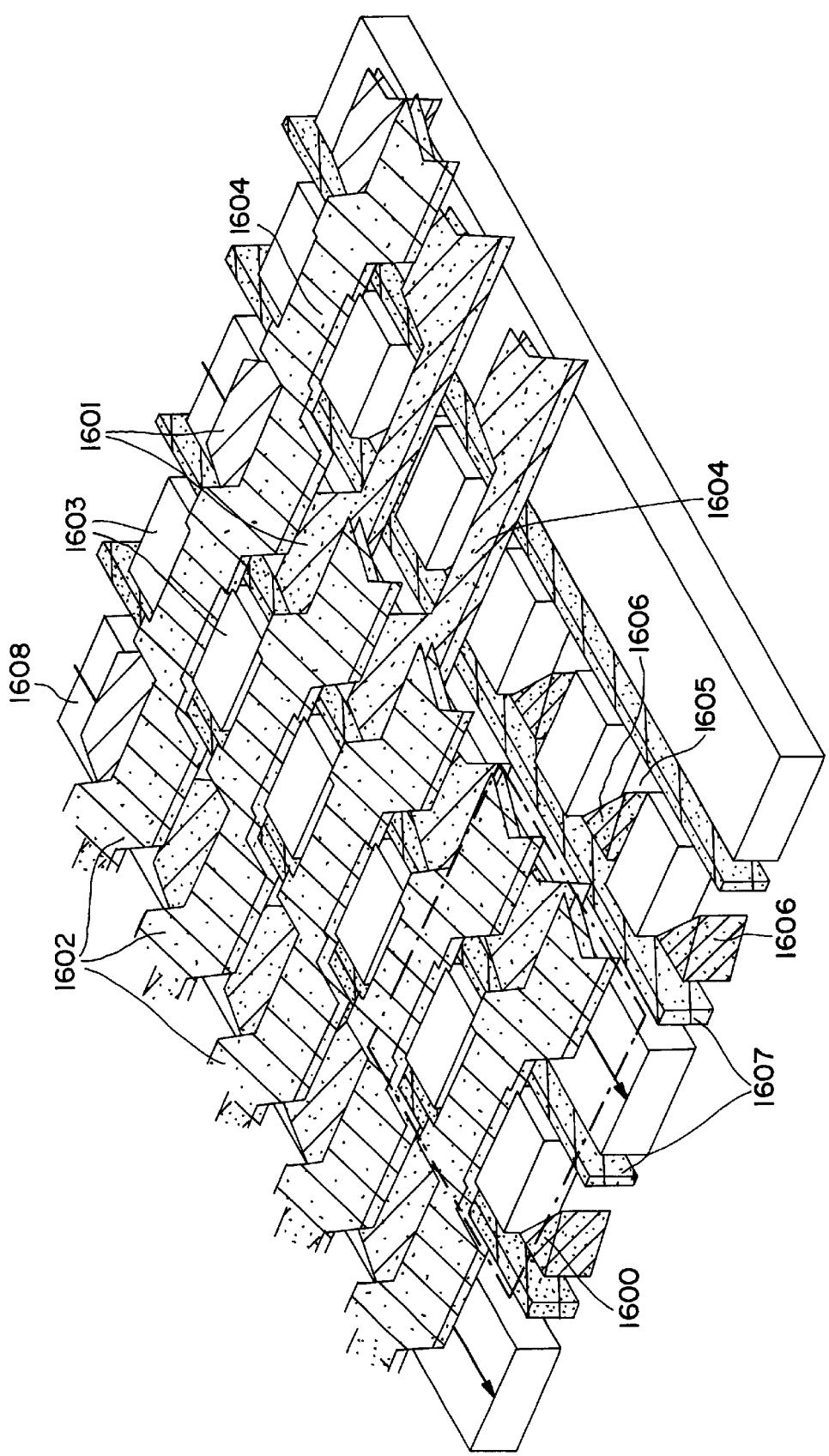
FIG. 38 is a perspective view of the solid state imaging device.

FIGS. 37 and 38 show an example of a two-dimensional solid state imaging device in which the arrangement shown in FIG. 2 is realized by using the unit pixel having the element structure shown in FIGS. 9, 10, 11, and 12. In the example, when NDs are to be mixed and read, a read gate which has been used as an isolating portion in the A-field in accordance with the applied voltage (for example, 0 V) is used in the B-field as a read gate for mixing and reading signal charges of two adjacent photoelectric converting portions, by setting the applied voltage (for example, 15 V), thereby improving the vertical resolution.

FIG. 37 shows a plan view of a two-dimensionally arrayed solid state imaging device. In order to facilitate the understanding of the internal structure, a part of the device is cut away in such a manner that the degree of the cutting is deeper as moving in the lower right corner in the figure. The components include: a first polysilicon layer 1601; a second polysilicon layer 1602; a PD 1620; a PD 1621; a PD 1622; a PD 1623; a PD 1624; a PD 1625; a PD 1626; a read gate 1604 (which is formed by the gates of the first and second polysilicon layers); a read channel 1605 (in the embodiment, an N-layer) which is formed in a semiconductor below the read gate; a P-layer 1606 which prevents a signal charge from erroneously entering a VCCD of a unit pixel adjacent in a horizontal direction; a P-layer 1607 which defines the transfer channel region of a VCCD; and a VCCD 1608 which transfers a signal charge in the direction of the arrows. A unit pixel 1600 is indicated by a region enclosed by a broken line. In order to drive the two-dimensionally arrayed solid state imaging device, employed are driving pulses of eight phases in total, namely, a driving pulse $\phi$V1 1611, a driving pulse $\phi$V2 1612, a driving pulse $\phi$V3 1613, a driving pulse $\phi$V4 1614, a driving pulse $\phi$V5 1615, a driving pulse $\phi$V6 1616, a driving pulse $\phi$V7 1611, and a driving pulse $\phi$V8 1618.

FIG. 38 is a birds eye view of the two-dimensionally arrayed solid state imaging devices. In order to facilitate the understanding of the internal structure, a part of the device is cut away in such a manner that the degree, of the cutting is deeper as moving in the lower end in the figure. In the present proposal, as described above, the read gate has the structure shown in FIGS. 9, 10, 11, and 12. It is a matter of course that the pixel structures shown in FIGS. 13 to 16, 17 to 20, and 21 to 24 may be used.

Next, a fourteenth embodiment will be described with reference to FIGS. 39, 40, and 41.

Figure 39:
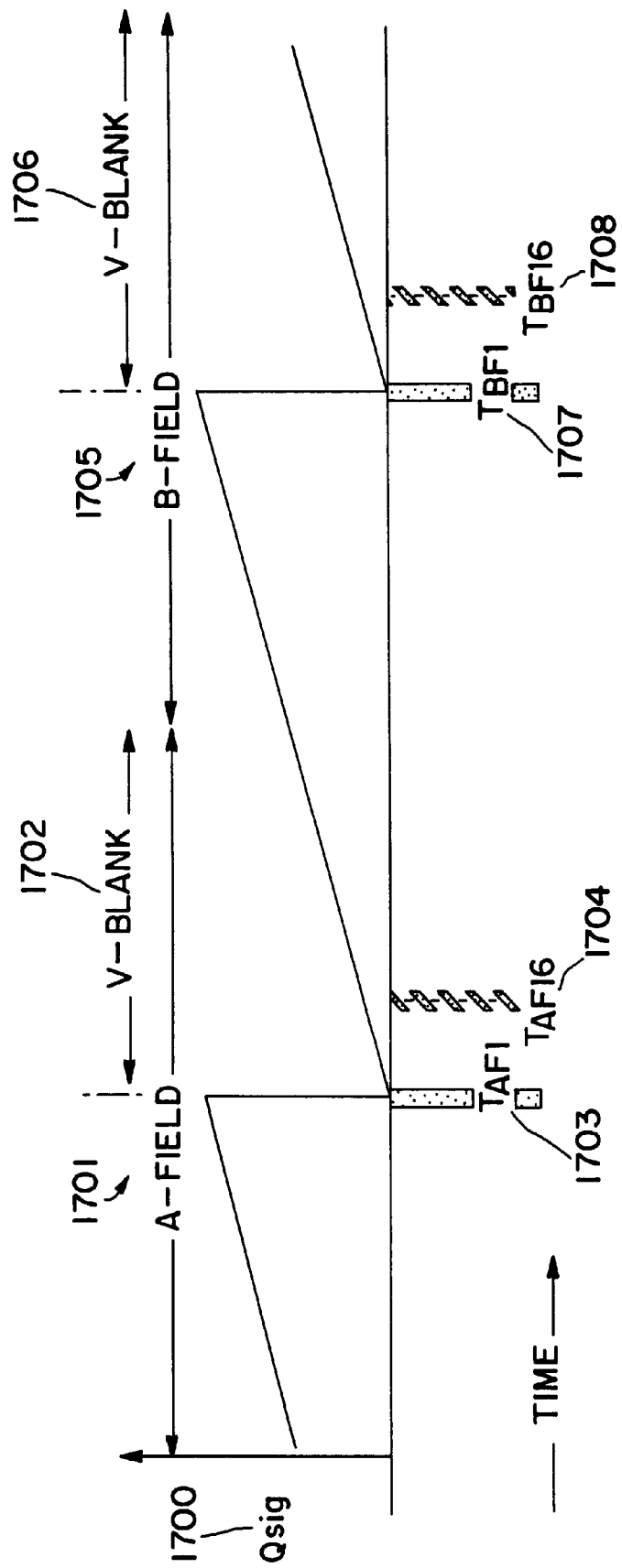
FIG. 39 is a diagram showing temporal variation of accumulated signal charges.
Figures 40A, 40B:
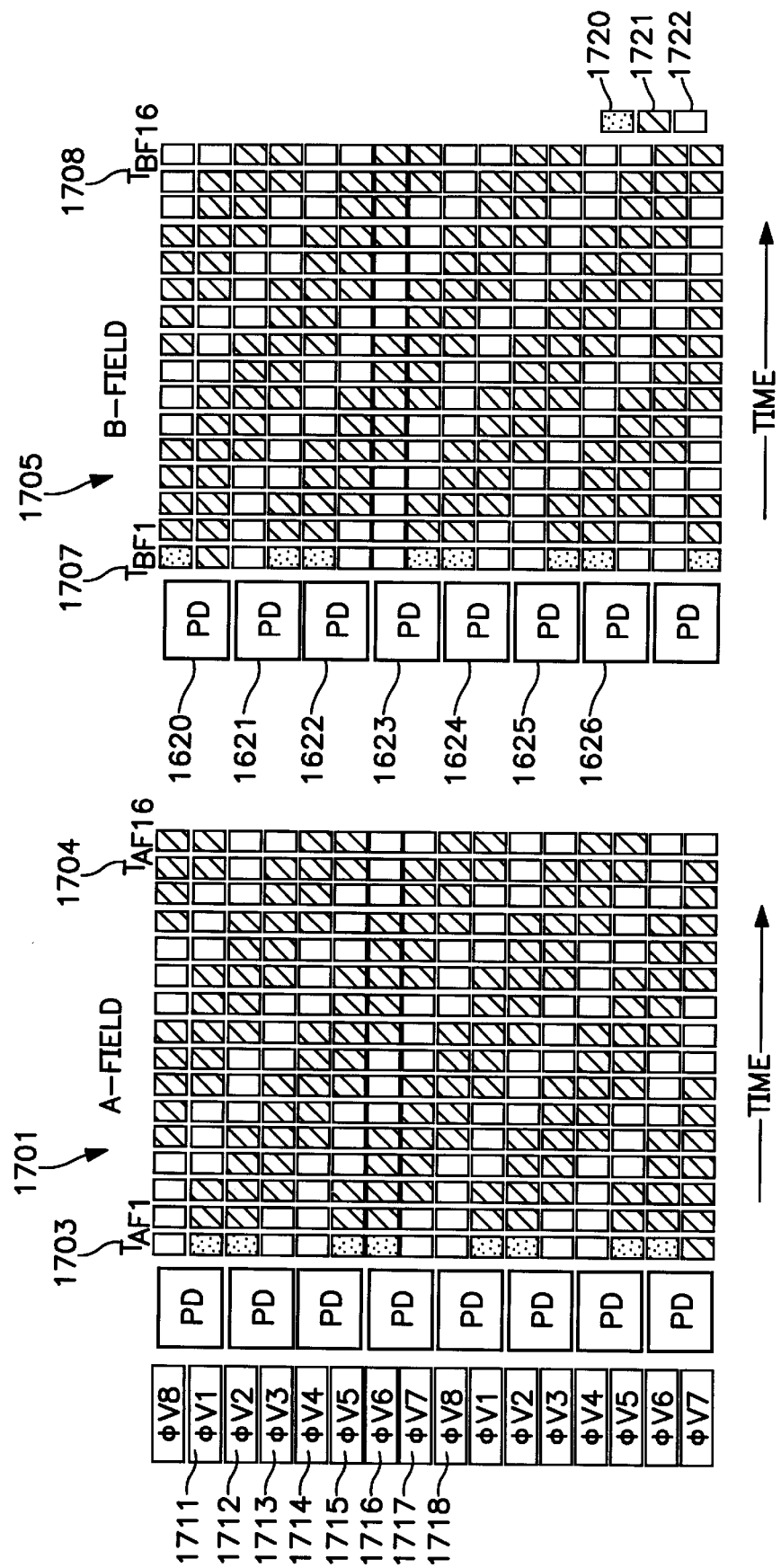
FIG. 40 is a chart of signal charge transfer.
Figure 4L:
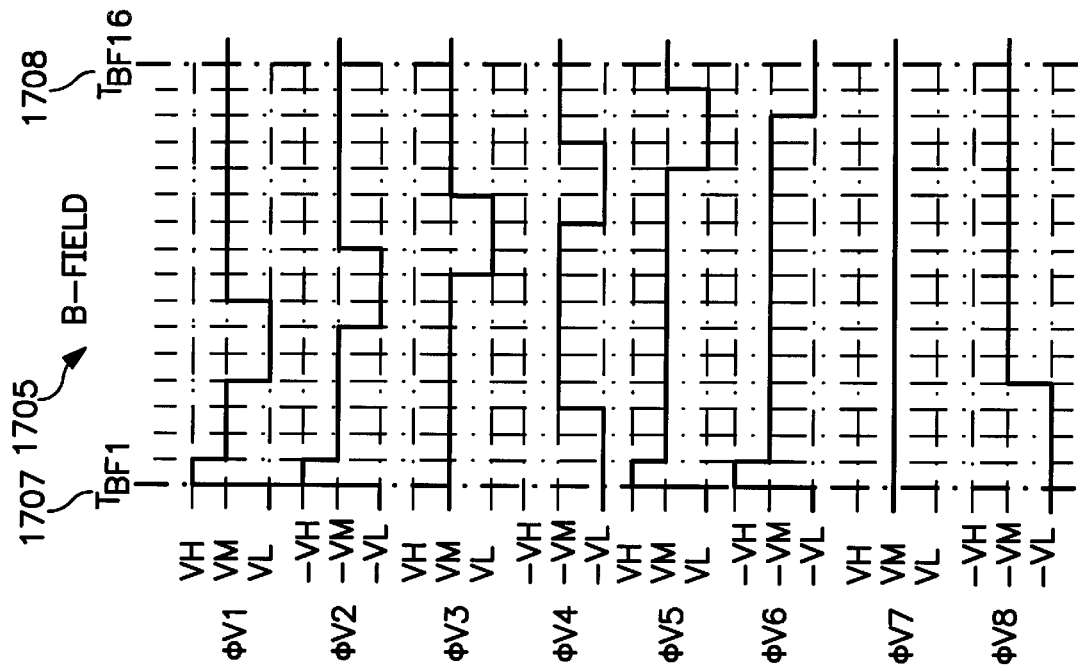
Figure 4L:
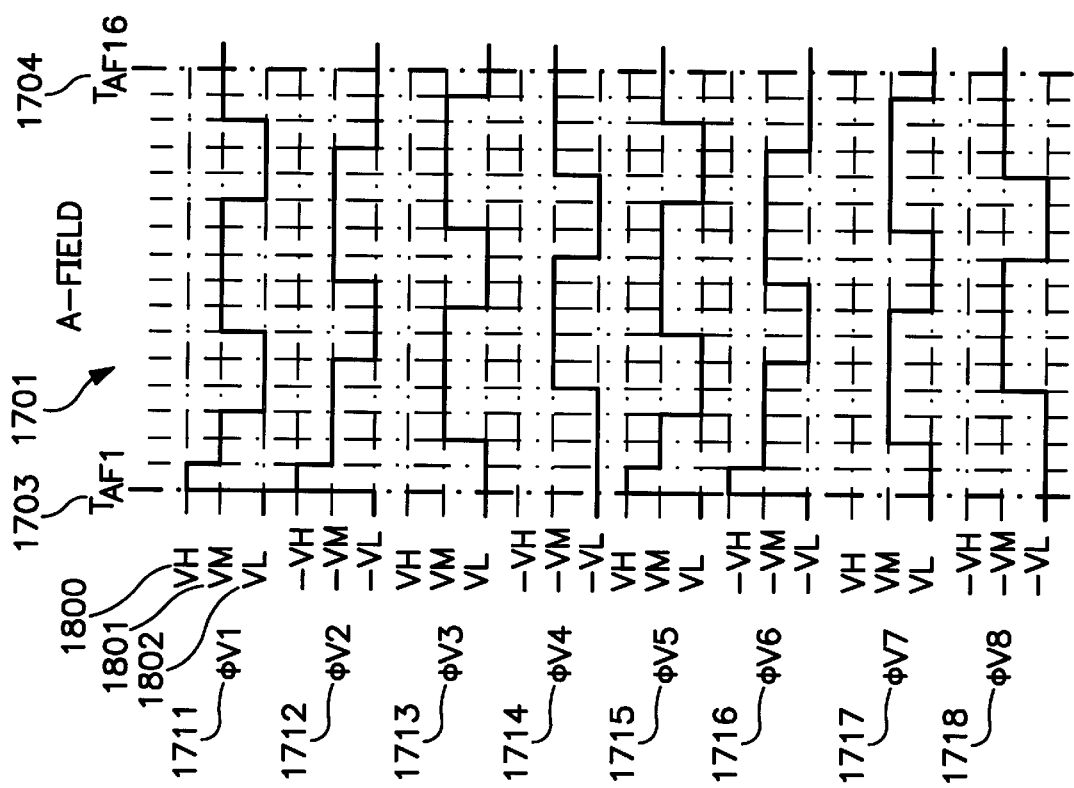

FIGS. 39 and 40 are diagrams showing the transfer of a signal charge, and FIG. 41 shows timing charts. These figures show an example of the operation of reading/transferring a signal charge in a solid state imaging device having an eight-phase electrode structure in a VCCD of a pixel portion.

FIG. 39 is a diagram showing a time chart in the case where the solid state imaging device having the eight-phase electrode structure shown in FIGS. 37 and 38 is subjected to the reading/transferring operation in a scan mode in accordance with NTSC. In the figure, the abscissa indicates the time, and the ordinate indicates a signal charge amount $Q_{sig}$ 1700 which is subjected to photoelectric conversion and accumulated with respect to light incident in the A-field period 1701 and the B-field period 1705. In the following description, it is assumed that a TAF1 1703 which is a time of reading a signal charge in the A-field period 1701, and a TBF1 1707 which is a time of reading a signal charge in the B-field period 1705 are set, to be immediately after the start of the V-blank period in each field. However, it should be emphasized that the reading time is not particularly restricted to the above.

FIG. 40 shows an example of the reading/transferring operation in which the two-pixel mixture is conducted. At the left end, indicated are the eight-phase driving pulses which are to be applied to the transfer electrode of the VCCD of each pixel (namely, a driving pulse φV1 1711, a driving pulse φV2 1712, a driving pulse φV3 1713, a driving pulse φV4 1714, a driving pulse φV5 1715, a driving pulse φV6 1716, a driving pulse φV7 1717, and a driving pulse φV8 1718). The figure diagrammatically shows the flow of a series of operations of transferring a signal charge which use a signal charge transfer packet, starting from the reading operation at the TAF1 1703 and ending at the time of a TAF21 1704, in accordance with the elapse of time (in this case, at each clock pulse).

In FIG. 40, each solid square indicates the signal charge reading 1720, each hatched square indicates a signal charge packet 1721, and each hollow square indicates a barrier 1722. In the A-field 1701 shown in the left portion, in the reading operation at the TAF1 1703, the signal charge of the PD 1620 is mixed with that of the PD 1621 and the signal charge of the PD 1622 is mixed with that of the PD 1623. In the B-field 1705 shown in the right portion of FIG. 40, the operation is executed in which the signal charge of the PD 1621 is mixed with that of the PD 1622 and the signal charge of the PD 1623 is mixed with that of the PD 1624.

FIG. 41 shows timing charts of the eight-phase driving pulses (φV1 1711, φV2 1712, φV3 1713, φV4 1714, φV5 1715, φV6 1716, φV7 1717, and φV8 1718) which enable the mixture of signal charges in the pixel and the subsequent signal charge transfer to be executed, during the period from the TAF1 1703 to the TAF16 1704 in the A-field and that from the TBF1 1707 to the TBF16 1708 in the B-field. In this case, it is assumed that voltages of 15 V, 0 V, and −8 V are supplied as VH 1800, VM 1801, and VL 1802, respectively. It should be additionally mentioned that the signal charge transfer of FIG. 40 can be realized without restricting the useful voltages to the three values or two values as described above.

Next, a fifteenth embodiment will be described with reference to FIGS. 42, 43, and 44.

Figure 42:
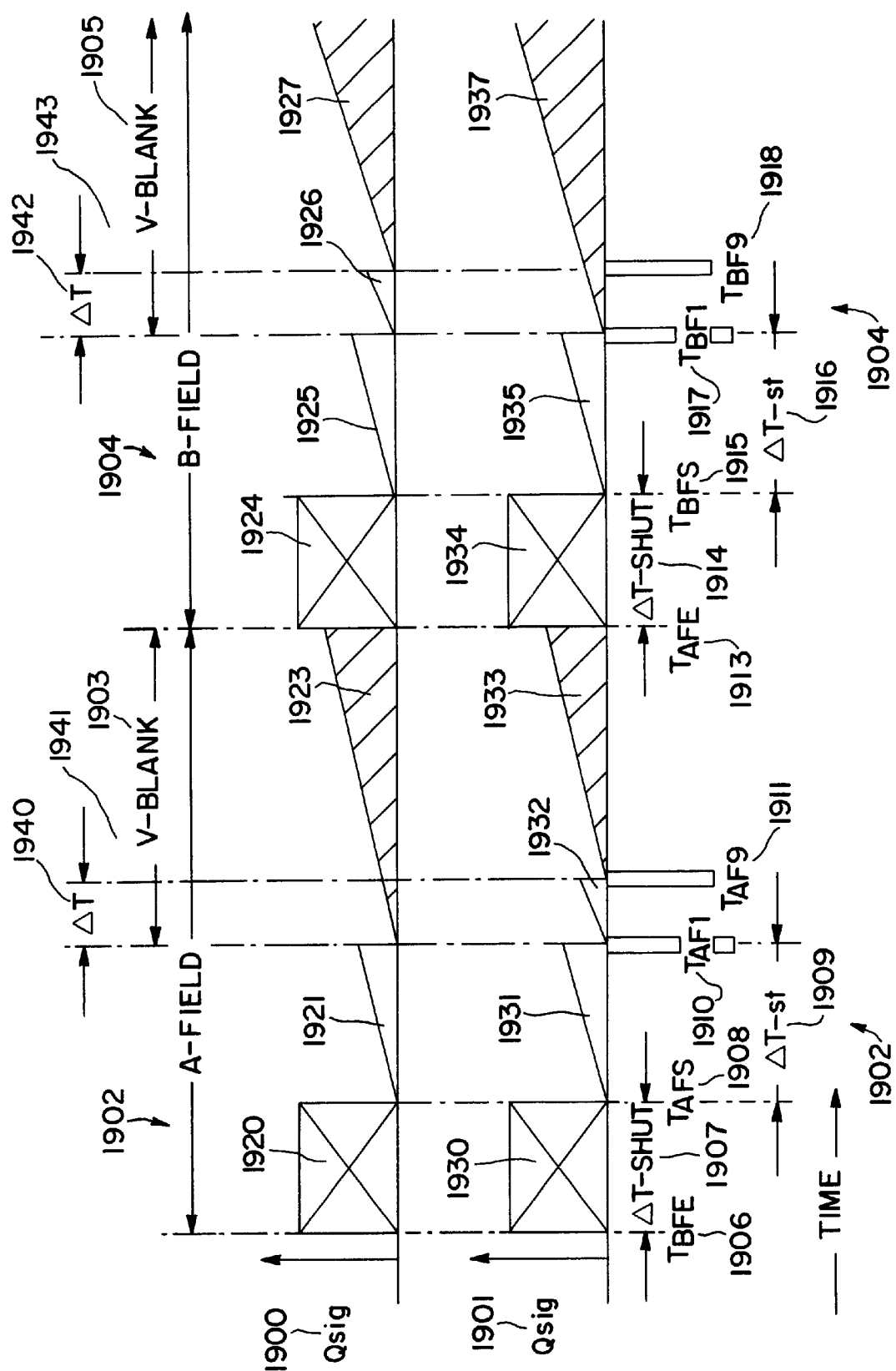
FIG. 42 is a diagram showing temporal variation of accumulated signal charges.

FIGS. 42 and 43 are diagrams showing the transfer of a signal charge, and FIG. 44 shows timing charts. These figures show an example of the operation of reading/transferring a signal charge in a solid state imaging device having an eight-phase electrode structure in a VCCD of a pixel portion.

FIG. 42 is a diagram showing a time chart in the case where the solid state imaging device having the eight-phase electrode structure shown in FIGS. 37 and 38 is subjected to the reading/transferring operation in a scan mode in accordance with NTSC. The upper portion of the figure shows the temporal variation of a signal charge amount $Q_{sig}$ 1900 which is accumulated in a photoelectric converting portion of an odd-numbered line represented by a PD 1960, and the lower portion shows the temporal variation of a signal charge amount $Q_{sig}$ 1901 which is accumulated in a photoelectric converting portion of an even-numbered line represented by a PD 1961. In the figure, the abscissa indicates the time, and the ordinate indicates a signal charge amount $Q_{sig}$ which is subjected to photoelectric conversion and accumulated in the PDs in the A-field period 1902 and the B-field period 1904.

In the periods of T-shut 1907 from a TBFE 1906 to a TAFS 1908 and T-shut 1914 from a TAFE 1913 to a TBFS 1915, operation periods of sweeping a signal charge toward the substrate in accordance with a known VOD (Vertical Overflow Drain) structure, or an electronic shutter period A 1920, an electronic shutter period A 1930, an electronic shutter period B 1924, and an electronic shutter period B 1934 are provided so that signal charges accumulated in the PDs are simultaneously swept toward the substrate.

Signal charges in the subsequent periods, or a first exposure period A 1921, a first exposure period A 1931, a first exposure period B 1925, and a first exposure period B 1935 are read at the time of a TAF1 1910 and a TBF1 1917. In the figure, these accumulation periods are indicated as T-st 1909 and T-st 1916, respectively. Signal charges accumulated in a second exposure period A 1932, and a second exposure period B 1926 are read at the time of a TAF9 1911 and a TBF9 1918. Signal charges accumulated in a disposal period A 1923, a disposal period A 1933, a disposal period B 1927, and a disposal period B 1937 are swept toward the substrate by the above-mentioned electronic shutter operation. In the following description, it is assumed that the TAF1 1910 which is a time of reading a signal charge in the A-field period 1902, and a TBF1 1917 which is a time of reading a signal charge in the B-field period 1904 are set to be immediately after the start of the V-blank period in each field. However, it should be emphasized that, in the present proposal, the reading time is not particularly restricted to the above-mentioned one.

The series of operations described in conjunction with FIG. 42 will be described in more detail with reference to FIG. 43.

FIG. 43 shows an example of the reading/transferring operation in which the two-pixel mixture is conducted. At the left end, indicated are the eight-phase driving pulses which are to be applied to the transfer electrode of the VCCD of each pixel (namely, φV1 1951, φV2 1952, φV3 1953, φV4 1954, φV5 1955, φV6 1956, φV7 1957, and φV8 1958). The figure shows the flow of a series of operations of transferring a signal charge which use a signal charge transfer packet, starting from the reading operation at the TAF1 1910 and ending at an elapse of 16 clock pulses, in accordance with the elapse of time (in this case, at each clock pulse).

In FIG. 43, each solid square indicates the signal charge reading 1967, each hatched square indicates a signal charge packet 1968, and each hollow square indicates a barrier 1969. In the A-field 1902 shown in the left portion, in the reading operation at the TAF1 1910, four continuous PDs are simultaneously read as one set. For example, PDs 1960, 1961, 1962, and 1963 are simultaneously read as one unit. In the subsequent reading operation at the TAF9 1911, two continuous PDs are simultaneously read as one set at two-PD intervals. For example, the PDs 1961 and 1962 are simultaneously read as one unit. At this time, signal charges of the PDs 1960 and 1963 which are not read are swept toward the substrate by the electronic shutter operation which is conducted at the start of the B-field period 1904.

In the B-field 1904 shown in the right portion, in the reading operation at the TBF1 1917, four continuous PDs are simultaneously read as one set. For example, PDs 1962, 1963, 1964, and 1965 are simultaneously read as one unit. In the subsequent reading operation at the TBF9 1918, two continuous PDs are simultaneously read as one set at two-PD intervals. For example, the PDs 1963 and 1964 are simultaneously read as one unit. At this time, signal charges of the PDs 1961 and 1962 which are not read are swept toward the substrate by the electronic shutter operation which is conducted at the start of the B-field period 1904.

FIG. 44 shows timing charts of the eight-phase driving pulses ($\phi$V1 1951, $\phi$V2 1952, $\phi$V3 1953, $\phi$V4 1954, $\phi$V5 1955, $\phi$V6 1956, $\phi$V7 1957, and $\phi$V8 1958) which enable the mixture of signal charges in the pixel and the subsequent signal charge transfer to be executed, during the period from the TAF1 1910 to an elapse of 16 clock pulses in the A-field and that from the TBF1 1917 to an elapse of 16 clock pulses in the B-field. In this case, it is assumed that voltages of 15 V, 0 V, and −8 V are supplied as VH 2000, VM 2001, and VL 2002, respectively. It should be additionally mentioned that the signal charge transfer of FIG. 43 can be realized without restricting the useful voltages to the three values or two values as described above.

In the embodiment, it should be emphasized that the employment of the element structure and driving method of the present proposal enables the reading of accumulated charges in the first exposure period and that of accumulated charges in the second exposure period to be simultaneously conducted.

Furthermore, both periods of T 1940 and T 1942 respectively corresponding to the second exposure period A 1932 and the second exposure period B 1926 can be changed. While changing the T-shut 1907 in the A-field and the T-shut 1914 in the B-field, therefore, both the periods of T 1940 and T 1942 corresponding to the second exposure period A 1932 and the second exposure period B 1926 can be changed. The device may be used in another manner in which, in the A-field, only the period of the T-st 1909 corresponding to the first exposure periods A 1921 and 1931 is independently changed by adjusting the T-shut 1907 and the second exposure period A 1932 is held constant. Alternatively, while holding constant a ratio of the T-st 1909 corresponding to the first exposure periods A 1921 and 1931 and the T 1940 corresponding to the second exposure period A 1932, the exposure period of the total of the T-st and the T may be adjusted. It is a matter of course that, in either of the use manners, the same handling may be executed also in the B-field.

It is a matter of course that the electronic shutter periods A 1920 and 1930, and the electronic shutter periods B 1924 and 1935 in the embodiment may be executed in the embodiments represented by FIGS. 31, 34, and 39. When an image input device is configured by using the embodiment, a mechanical aperture mechanism can be eliminated so that the device is low in power consumption and excellent in shock resistance. Accordingly, the image input device can be applied to a portable picture telephone, a vehicle camera, an artificial eye, an endoscope, an electronic still camera, an image input terminal for a personal computer, or the like.

Next, a sixteenth embodiment will be described with reference to FIG. 45.

FIG. 45 shows the solid state imaging device 2100 of the present proposal represented by FIGS. 25 and 26 or 37 and 38 which can employ one of the driving methods shown in FIGS. 27 to 44, and a counter/timer unit 2101 through which exposure periods such as the first exposure periods A 1211, 1220, 1411, 1420, 1921, and 1931, the second exposure periods A 1212, 1221, 1412, 1421, and 1932, the first exposure periods B 1213, 1222, 1413, 1422, 1925, and 1935, and the second exposure periods B 1214, 1223, 1414, 1423, and 1926 are set. A count value or a timer value for setting the exposure periods represented by the above are transmitted through a timer output line 2103 to an external apparatus 2102 which processes or records an image signal transmitted through a signal output line 2104. Accordingly, a calculation process which relates to the image processing and is to be conducted in a subsequent stage can be easily conducted. For example, the intensity of incident light is reversely estimated on the basis of the count value or the timer value. When an image input device is configured by using the embodiment, a mechanical aperture mechanism can be eliminated so that the device is low in power consumption and excellent in shock resistance. Accordingly, the image input device can be applied to a portable picture telephone, a vehicle camera, an artificial eye, an endoscope, an electronic still camera, an image input terminal for a personal computer, or the like.

As seen from the above description, according to the invention, the transfer of a signal charge can be easily conducted and the light amount range can be expanded toward a higher illuminance side. Therefore, the invention can attain very excellent practical effects.

What is claimed is:

1. A solid state imaging device unit pixel which comprises:

at least one photoelectric converting portion which contains a first impurity and which converts electromagnetic waves or x-rays entering said unit pixel into signal charges;

charge transferring means adjacent said photoelectric converting portion in an x-direction, for transferring said signal charges in a y-direction, first means, situated at boundaries of a plurality of said photoelectric converting portions and adjacent thereof in the y-direction, for isolating said photoelectric converting portions from each other, and for receiving from only the y-direction said signal charges from said photoelectric converting portions before transferring said signal charges in the x-direction to said charge transferring means, and wherein between the photoelectric converting portions in the x-direction there is no reading means.

2. A driving method for a solid state imaging device wherein a plurality of unit pixels are arranged in a one-dimensional direction of y-direction or in two-dimensional directions of x- and y-directions and one of said unit pixels comprises:

at least one photoelectric converting portion which is disposed in order to convert an electromagnetic wave or an x-ray entering said unit pixels into a signal charge and which contains a first impurity; and charge transferring means adjacent to said photoelectric converting portion in an x-direction and for transferring said signal charge in a y-direction, and at boundaries of photoelectric converting portions adjacent to each other in the y-direction in the solid state imaging device, there is first means which serves as isolating said photoelectric converting portions from each other, and also as reading a signal charge from said photoelectric converting portion into said charge transferring means, and when said device is driven, the isolating function and the reading function are realized alternatively in the y-direction, by the first means at a specific field and further at a next field the isolating function and the reading function are exchanged.

3. A solid state imaging device wherein a plurality of unit pixels are arranged in a one-dimensional direction of y-direction or in two-dimensional directions of x- and y-directions and one of said unit pixels comprises:

at least one photoelectric converting portion which is disposed in order to convert an electromagnetic wave or an x-ray entering said unit pixels into a signal charge and which contains a first impurity; and charge transferring means adjacent to said photoelectric converting portion in an x-direction and for transferring said signal charge in a y-direction, and at boundaries of photoelectric converting portions adjacent to each other in the y-direction in the solid state imaging device, there are alternatively in y-direction (1) isolating means for isolating said photoelectric converting portions from each other, and (2) reading means for reading a signal charge from said photoelectric converting portion into said charge transferring means.

4. A solid state imaging device according to claim 3, wherein said reading means has at least one electrode at an upper side and a semiconductor portion at a lower side and the semiconductor portion has a gradient incline of concentration distribution of impurity in a direction towards the charge transferring means.

5. A solid state imaging device according to claim 4, wherein said incline of concentration of distribution is formed by at least two ion implantations.

6. A solid state imaging device according to claim 4, wherein said incline of concentration of distribution of impurity has a 1a–th structure in which a concentration distribution of a first impurity becomes higher or a concentration distribution of a second impurity which is opposite to said first impurity becomes lower as moving toward said charge transferring means, or a 1b–th structure in which an impurity distribution is changed from said second impurity to said first impurity.

7. A solid state imaging device according to claim 6, wherein said semiconductor portion of at least one of said first means which are disposed neighboring with said photoelectric converting portion is formed by at least two ion implantations.

8. A method of driving a solid state imaging device having such charge transferring means having eight continuous transfer electrodes for transferring charges generated from neighboring unit a pixel A and a unit pixel B, wherein a first and second signal charge transfer packets are generated under the transfer electrodes, comprising the steps of:

a) utilizing an electromagnetic wave or an X-ray to generate a first signal charge A during a first accumulation period of said unit pixel A, b) utilizing an electromagnetic wave or an X-ray to generate a first signal charge B during a second accumulation period of said unit pixel B, c) reading said first signal charge A and said first signal charge B at the same timing, d) mixing and accumulating said read first signal charge A and said read first signal charge B to said first signal charge packet, e) utilizing an electromagnetic wave or an X-ray to generate a second signal charge A during a third accumulation period of said unit pixel A, f) utilizing an electromagnetic wave or an X-ray to generate a second signal charge B during a fourth accumulation period of said unit pixel B, g) reading said second signal charge A and said second signal charge B at the same timing, h) mixing and accumulating said read second signal charge A and said read second signal charge B to said second signal charge packet, wherein at least one of sets of said first and second accumulation periods and said third and fourth accumulation periods have the same accumulation period.

9. A method of driving a solid state imaging device according to claim 8, wherein in each of A- and B-fields of an NTSC signal corresponding to a signal charge accumulation period, an electronic shutter operation is conducted by means typified by a VOD (Vertical Overflow Drain), thereby controlling a total period of said first to fourth accumulation periods.

10. A method of driving a solid state imaging device according to claim 8, wherein in each of A- and B-fields of an NTSC signal corresponding to a signal charge accumulation period, an electronic shutter operation is conducted by means typified by a VOD (Vertical Overflow Drain), thereby controlling said first and second accumulation periods.

11. A method of driving a solid state imaging device according to claim 8, wherein in each of A- and B-fields of an NTSC signal corresponding to a signal charge accumulation period, an electronic shutter operation is conducted by means typified by a VOD (Vertical Overflow Drain), thereby controlling said third and fourth accumulation periods.

12. A method of driving a solid state imaging device according to claim 8, wherein in each of A- and B-fields of an NTSC signal corresponding to a signal charge accumulation period, an electronic shutter operation is conducted by means typified by a VOD (Vertical Overflow Drain), thereby controlling said first to fourth accumulation periods while holding constant an accumulation period ratio of a set of said third and fourth accumulation periods with respect to a set of said first and second accumulation periods, or while holding said accumulation period ratio to be 8% or less.

13. A method of driving a solid state imaging device according to claim 8, wherein said method uses an interface for receiving from and passing to an external apparatus said first to fourth accumulation periods, or a count value of a counter for setting said first to fourth accumulation periods, said count value corresponding to an accumulation period.

14. A solid state imaging device wherein a plurality of unit pixels are arranged in a one-dimensional direction of y-direction or in two-dimensional directions of x- and y-directions and one of said unit pixels comprises:

at least one photoelectric converting portion which is disposed in order to convert an electromagnetic wave or an x-ray entering said unit pixel into a signal charge and which contains a first impurity; and charge transferring means adjacent to said photoelectric converting portion in an x-direction and for transferring said signal charge in a y-direction, and at boundaries of photoelectric converting portions adjacent to each other in the y-direction in the solid state imaging device, there is first means which serves as isolating said photoelectric converting portions from each other, and also as reading a signal charge from said photoelectric converting portion into said charge transferring means, and further, there is no reading means between the photoelectric converting portions in the x-direction.

15. A solid state imaging device according to claim 14, wherein said first means has at least one electrode at an upper side and a semiconductor portion at a lower side and the semiconductor portion has a gradient of concentration distribution of impurity in a direction towards the charge transferring means.

16. A solid state imaging device according to claim 15, wherein said incline of concentration of distribution of impurity has a 1a–th structure in which a concentration distribution of a first impurity becomes higher or a concentration distribution of a second impurity which is opposite to said first impurity becomes lower as moving toward said charge transferring means, or a 1b–th structure in which an impurity distribution is changed from said second impurity to said first impurity.

17. A solid state imaging device according to claim 16, wherein said semiconductor portion of at least one of said first means which are disposed neighboring with said photoelectric converting portion is formed by at least two ion implantations.

18. A solid state imaging device according to claim 4, wherein at least one of said electrodes is formed in a manner that an edge of said electrode covers wholly or partly at least one of said photoelectric converting portions which are disposed neighboring with said electrode.

19. A solid state imaging device according to claim 18, wherein said at least one electrode is supplied with a voltage by different driving pulses.

20. A solid state imaging device according to claim 18, wherein said semiconductor portion has a first reading structure in which at least one delta-shaped or fan-like shaped implantation region due to a P-type impurity, and a width of said delta shape or fan-like shape is made smaller as moving toward said charge transferring means.

21. A solid state imaging device according to claim 20, wherein said first reading structure is employed in at least one of boundaries between first and second photoelectric converting portions and second and third photoelectric converting portions, said first to third photoelectric converting portions being disposed continuously in the Y-direction.

22. A solid state imaging device according to claim 18, wherein said semiconductor portion has a second reading structure in which at least one delta-shaped or fan-like shaped implantation region due to an N-type impurity, and a width of said delta shape or fan-like shape is made larger as moving toward said charge transferring means.

23. A solid state imaging device according to claim 18, wherein said semiconductor portion has a third reading structure in which one or both of said first and second impurities are formed by at least one ion implantation.

24. A solid state imaging device according to claim 18, wherein said semiconductor portion has a fourth reading structure in which at least one electrode is formed via an oxide film above a semiconductor substrate, and a width of said at least one electrode in the Y-direction is made larger as moving toward said charge transferring means in the Y-direction.

25. A solid state imaging device according to claim 24, wherein eight different driving pulses are respectively applied to a total of eight transfer electrodes of said charge transferring means in two unit pixels which are continuous in the Y-direction.

26. A solid state imaging device according to claim 24, wherein for charge transferring means (typified by a CCD) possessed by two continuous unit pixels, one signal charge transfer packet is disposed below continuous electrodes among said eight transfer electrodes, the number of said continuous electrodes being seven at the maximum.

27. A solid state imaging device according to claim 24, wherein for charge transferring means (typified by a CCD) possessed by two continuous unit pixels, at least two signal charge transfer packets are disposed, and at least one potential barrier is disposed between said at least two signal charge transfer packets.

28. A solid state imaging device according to one of claims 1, 3, 15, and 4, wherein the number of transfer electrodes of said charge transferring means in each of said unit pixels is four.

29. A solid state imaging device according to claim 28, wherein for said charge transferring means (typified by a CCD) possessed by continuous unit pixels A and B, first and second signal charge transfer packets having a total of eight continuous transfer electrodes are disposed; a first signal charge A generated by an electromagnetic wave or X-ray signal during a first accumulation period of said unit pixel A, and a first signal charge B generated by the electromagnetic wave or X-ray signal during a second accumulation period of said unit pixel B are added and mixed to said first signal charge packet at different read timings; and a second signal charge A generated by the electromagnetic wave or the X-ray during a third accumulation period of said unit pixel A, and a second signal charge B generated by the electromagnetic wave or the X-ray during a fourth accumulation period of said unit pixel B are added and mixed to said second signal charge packet at different read timings and transferred.

30. A solid state imaging device according to claim 29, wherein said device further comprises an interface for receiving from and passing to an external apparatus said first to fourth accumulation periods, or a count value of a counter for setting said first to fourth accumulation periods, said count value corresponding to an accumulation period.

31. A solid state imaging device according to claim 28, wherein for said charge transferring means (typified by a CCD) possessed by continuous unit pixels A and B, first and second signal charge transfer packets having a total of eight continuous transfer electrodes are disposed; a first signal charge A generated by an electromagnetic wave or X-ray signal during a first accumulation period of said unit pixel A, and a first signal charge B generated by the electromagnetic wave or X-ray signal during a second accumulation period of said unit pixel B are added and mixed to said first signal charge packet at different read timings; and a second signal charge A generated by the electromagnetic wave or the X-ray during a third accumulation period of said unit pixel A, and a second signal charge B generated by the electromagnetic wave or the X-ray during a fourth accumulation period of said unit pixel B are added and mixed to said second signal charge packet at different read timings, at least one of sets of said first and second accumulation periods and said third and fourth accumulation periods having the same accumulation period.

32. A solid state imaging device according to claim 31, wherein said device further comprises an interface for receiving from and passing to an external apparatus said first to fourth accumulation periods, or a count value of a counter for setting said first to fourth accumulation periods, said count value corresponding to an accumulation period.

* * * * *